US012619807B1

(12) United States Patent
Mogill

(10) Patent No.: US 12,619,807 B1
(45) Date of Patent: May 5, 2026

(54) APPARATUS AND METHOD FOR GENERATING A PREDICTED OUTPUT

(71) Applicant: Crisp, Inc., Atlanta, GA (US)

(72) Inventor: Michael Mogill, Atlanta, GA (US)

(73) Assignee: Crisp, Inc., Atlanta, GA (US)

( * ) Notice: Subject to any disclaimer, the term of this patent is extended or adjusted under 35 U.S.C. 154(b) by 0 days.

(21) Appl. No.: 19/349,427

(22) Filed: Oct. 3, 2025

(51) Int. Cl.
*G06F 30/27* (2020.01)

(52) U.S. Cl.
CPC ................................... *G06F 30/27* (2020.01)

(58) Field of Classification Search
CPC ...................................................... G06F 30/27
See application file for complete search history.

(56) References Cited

U.S. PATENT DOCUMENTS

2022/0326680 A1    10/2022  Sakata et al.
2023/0168640 A1 *   6/2023  Ramanasankaran ... G05B 13/04
                                                700/275
2023/0186201 A1 *   6/2023  Cella .................. G05B 23/0294
                                                705/7.17
2025/0217114 A1 *   7/2025  Roper, Jr. ................ G06N 3/02

FOREIGN PATENT DOCUMENTS

CN          119886945 A     10/2022
CN          116679581 A      9/2023
WO       2022217263 A1     10/2022

OTHER PUBLICATIONS

BenchOnDemand, Linkedin post, Jan. 31, 2025 Digital Twins in Recruitment: Simulating Candidate Job Fit https://www.linkedin.com/pulse/digital-twins-recruitment-simulating-candidate-job-fit-zsqkc.
Delev AI blog Digital Twin of an Employee: How DToEs Improve the Workplace Experience https://www.delve.ai/blog/digital-twin-of-an-employee.

* cited by examiner

*Primary Examiner* — Chuen-Meei Gan
(74) *Attorney, Agent, or Firm* — CALDWELL LLC

(57) ABSTRACT

An apparatus and method for generating a predicted output. The apparatus includes at least a processor and a memory communicatively connected to the at least a processor. The memory instructs the processor to receive a digital twin comprising at least a plurality of virtual nodes, wherein each node is associated with an entity of a plurality of entities, determine a first scenario of a plurality of scenarios comprising one or more candidate nodes, wherein each candidate node is assigned a role of a plurality of roles within the digital twin, integrate the first scenario with the digital twin, calculate, using an AI simulator, scores corresponding to a plurality of variables associated with the integration of the first scenario and the digital twin, wherein the AI simulator propagates learned parameters through the digital twin, generate a predicted output as a function of the integration and the scores.

18 Claims, 7 Drawing Sheets

500

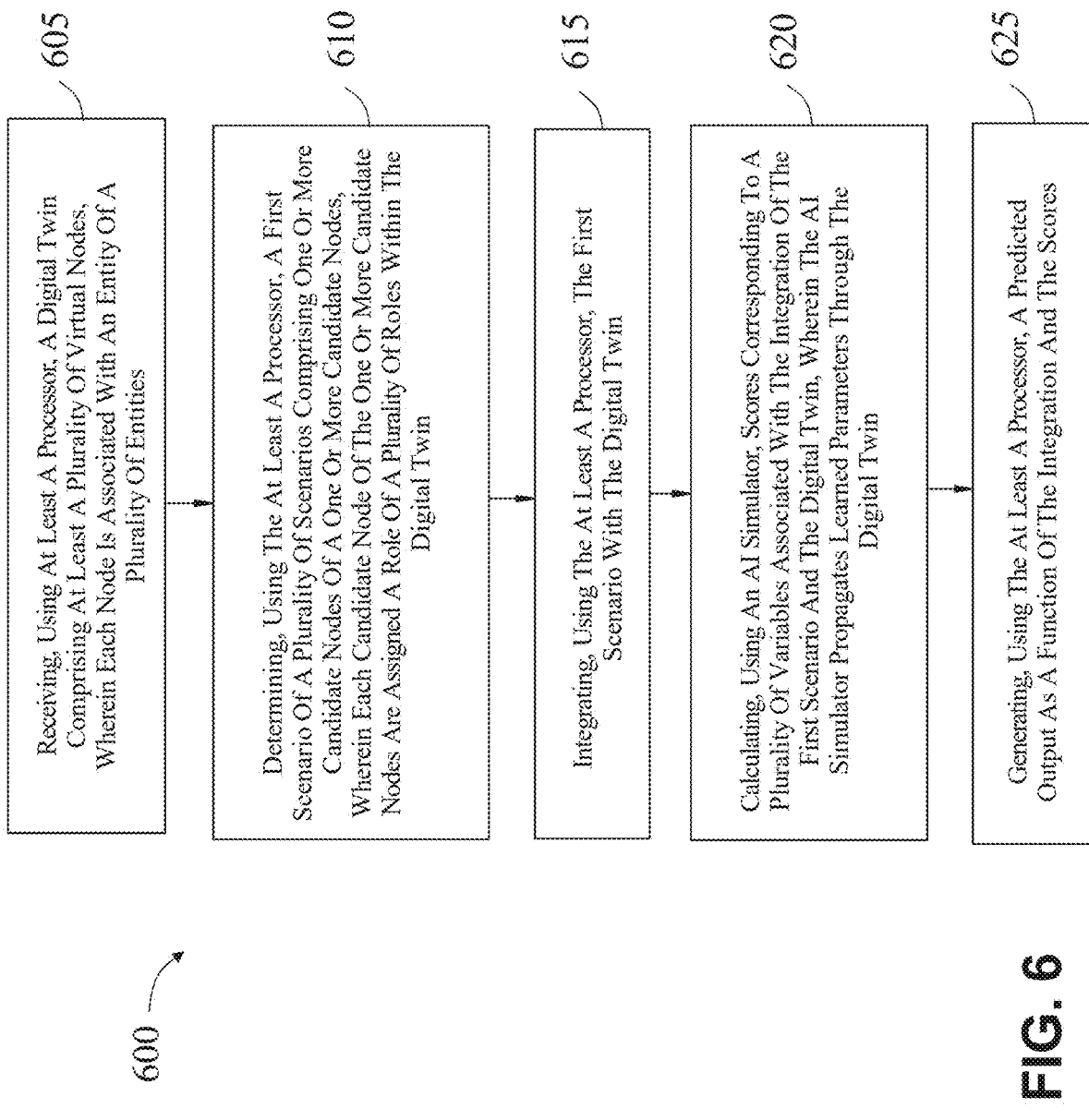

Receiving, Using At Least A Processor, A Digital Twin Comprising At Least A Plurality Of Virtual Nodes, Wherein Each Node Is Associated With An Entity Of A Plurality Of Entities

605

Determining, Using The At Least A Processor, A First Scenario Of A Plurality Of Scenarios Comprising One Or More Candidate Nodes Of A One Or More Candidate Nodes, Wherein Each Candidate Node Of The One Or More Candidate Nodes Are Assigned A Role Of A Plurality Of Roles Within The Digital Twin

610

Integrating, Using The At Least A Processor, The First Scenario With The Digital Twin

615

Calculating, Using An AI Simulator, Scores Corresponding To A Plurality Of Variables Associated With The Integration Of The First Scenario And The Digital Twin, Wherein The AI Simulator Propagates Learned Parameters Through The Digital Twin

620

Generating, Using The At Least A Processor, A Predicted Output As A Function Of The Integration And The Scores

APPARATUS AND METHOD FOR GENERATING A PREDICTED OUTPUT

FIELD OF THE INVENTION

The present invention generally relates to the field of machine learning. In particular, the present invention is directed to an apparatus and a method for generating a predicted output.

BACKGROUND

In many systems, it is difficult to predict how changes will affect the overall operation when multiple elements are interacting at once. Conventional models often cannot capture the detailed behaviors of different components, especially when those components follow distinct rules or constraints. As a result, predictions may lack accuracy and fail to reflect the actual behavior of the system under new conditions.

SUMMARY OF THE DISCLOSURE

In an aspect, an apparatus for generating a predicted output includes at least a processor and a memory communicatively connected to the at least a processor. The memory contains instructions configuring the processor to receive a digital twin comprising at least a plurality of virtual nodes, wherein each node is associated with an entity of a plurality of entities, determine a first scenario of a plurality of scenarios comprising one or more candidate nodes, wherein each candidate node is assigned a role of a plurality of roles within the digital twin, integrate the first scenario with the digital twin, calculate, using an AI simulator, scores corresponding to a plurality of variables associated with the integration of the first scenario and the digital twin, wherein the AI simulator propagates learned parameters through the digital twin, generate a predicted output as a function of the integration and the scores.

In another aspect, a method for generating a predicted output includes receiving, using at least a processor, a digital twin comprising at least a plurality of virtual nodes, wherein each node is associated with an entity of a plurality of entities, determining, using the at least a processor, a first scenario of a plurality of scenarios comprising one or more candidate nodes of a one or more candidate nodes, wherein each candidate node of the one or more candidate nodes are assigned a role of a plurality of roles within the digital twin, integrating, using the at least a processor, the first scenario with the digital twin, calculating, using an AI simulator, scores corresponding to a plurality of variables associated with the integration of the first scenario and the digital twin, wherein the AI simulator propagates learned parameters through the digital twin, generating, using the at least a processor, a predicted output as a function of the integration and the scores.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 6 is a block diagram of an exemplary method for generating a predicted output.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to apparatus and methods for generating a predicted output. The apparatus includes at least a computing device comprised of a processor and a memory communicatively connected to the processor. The memory instructs the processor to receive a digital twin comprising at least a plurality of virtual nodes, wherein each node is associated with an entity of a plurality of entities. The processor determines a first scenario of a plurality of scenarios comprising one or more candidate nodes, wherein each candidate node is assigned a role of a plurality of roles within the digital twin. The processor integrates the first scenario with the digital twin. Additionally, the processor calculates, using an AI simulator, scores corresponding to a plurality of variables associated with the integration of the first scenario and the digital twin, wherein the AI simulator propagates learned parameters through the digital twin. The processor generates a predicted output as a function of the integration and the scores.

Figure 1:
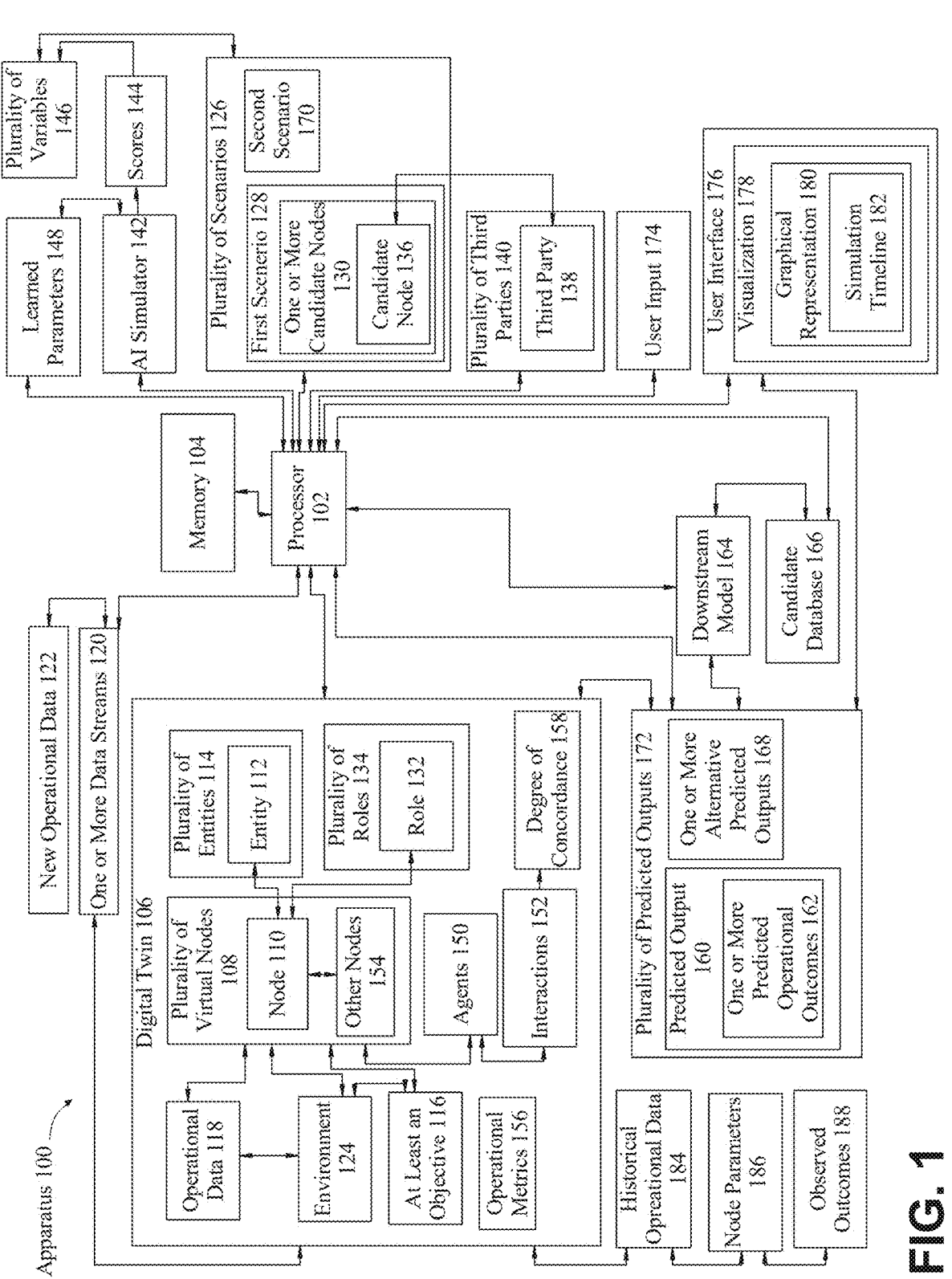
FIG. 1 is a block diagram of an apparatus for generating a predicted output.

Referring now to FIG. 1, an exemplary embodiment of apparatus 100 for generating a predicted output is illustrated. Apparatus 100 may include a processor 102 communicatively connected to a memory 104. As used in this disclosure, "communicatively connected" means connected by way of a connection, attachment, or linkage between two or more relata which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals there between may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 1, memory 104 may include a primary memory and a secondary memory. "Primary memory" also known as "random access memory" (RAM) for the purposes of this disclosure is a short-term storage device in which information is processed. In one or more embodiments, during use of the computing device, instructions and/or information may be transmitted to primary memory wherein information may be processed. In one or more embodiments, information may only be populated within primary memory while a particular software is running. In one or more embodiments, information within primary memory is wiped and/or removed after the computing device has been turned off and/or use of a software has been terminated. In one or more embodiments, primary memory may be referred to as "Volatile memory" wherein the volatile memory only holds information while data is being used and/or processed. In one or more embodiments, volatile memory may lose information after a loss of power. "Secondary memory" also known as "storage," "hard disk drive" and the like for the purposes of this disclosure is a long-term storage device in which an operating system and other information is stored. In one or remote embodiments, information may be retrieved from secondary memory and transmitted to primary memory during use. In one or more embodiments, secondary memory may be referred to as non-volatile memory wherein information is preserved even during a loss of power. In one or more embodiments, data within secondary memory cannot be accessed by processor. In one or more embodiments, data is transferred from secondary to primary memory wherein processor 102 may access the information from primary memory.

Still referring to FIG. 1, apparatus 100 may include a database. The database may include a remote database. The database may be implemented, without limitation, as a relational database, a key-value retrieval database such as a NOSQL database, or any other format or structure for use as database that a person skilled in the art would recognize as suitable upon review of the entirety of this disclosure. The database may alternatively or additionally be implemented using a distributed data storage protocol and/or data structure, such as a distributed hash table or the like. The database may include a plurality of data entries and/or records as described above. Data entries in database may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in database may store, retrieve, organize, and/or reflect data and/or records.

With continued reference to FIG. 1, apparatus 100 may include and/or be communicatively connected to a server, such as but not limited to, a remote server, a cloud server, a network server and the like. In one or more embodiments, the computing device may be configured to transmit one or more processes to be executed by server. In one or more embodiments, server may contain additional and/or increased processor power wherein one or more processes as described below may be performed by server. For example, and without limitation, one or more processes associated with machine learning may be performed by network server, wherein data is transmitted to server, processed and transmitted back to computing device. In one or more embodiments, server may be configured to perform one or more processes as described below to allow for increased computational power and/or decreased power usage by the apparatus 100 computing device. In one or more embodiments, computing device may transmit processes to server wherein computing device may conserve power or energy.

Further referring to FIG. 1, apparatus 100 may include any "computing device" as described in this disclosure, including without limitation a microcontroller, microprocessor, digital signal processor (DSP) and/or system on a chip (SoC) as described in this disclosure. Apparatus 100 may include, be included in, and/or communicate with a mobile device such as a mobile telephone or smartphone. Apparatus 100 may include a single computing device operating independently, or may include two or more computing devices operating in concert, in parallel, sequentially or the like; two or more computing devices may be included together in a single computing device or in two or more computing devices. Apparatus 100 may interface or communicate with one or more additional devices as described below in further detail via a network interface device. Network interface device may be utilized for connecting processor 102 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 102 may include but is not limited to, for example, a computing device or cluster of computing devices in a first location and a second computing device or cluster of computing devices in a second location. Apparatus 100 may include one or more computing devices dedicated to data storage, security, distribution of traffic for load balancing, and the like. Apparatus 100 may distribute one or more computing tasks as described below across a plurality of computing devices of computing device, which may operate in parallel, in series, redundantly, or in any other manner used for distribution of tasks or memory between computing devices. Apparatus 100 may be implemented, as a non-limiting example, using a "shared nothing" architecture.

With continued reference to FIG. 1, processor 102 may be designed and/or configured to perform any method, method step, or sequence of method steps in any embodiment described in this disclosure, in any order and with any degree of repetition. For instance, processor 102 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 102 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Still referring to FIG. 1, processor 102 is configured to receive a digital twin 106 comprising at least a plurality of virtual nodes 108, wherein each node 110 is associated with an entity 112 of a plurality of entities 114. As used in this disclosure, a "digital twin" is a virtual representation of a system, process, or environment that mirrors the structure, attributes, and behavior of corresponding real-world or conceptual entities 114. In a non-limiting example, a digital twin 106 may represent a law firm, an organization, or a collection of resources and their interactions under different scenarios. As used in this disclosure, a "virtual node" is a component of a digital twin 106 that serves as a placeholder or model of an entity 112. In an embodiment, the virtual node 110 encodes attributes, roles 134, and rules governing the behavior or interactions 152 of the entity 112. In a non-limiting example, a virtual node 110 may represent an individual professional, a department, a client, or a computational resource within the digital twin 106. As used in this disclosure, an "entity" is an identifiable individual, organization, system, or other definable unit that is represented within the digital twin 106 by a corresponding virtual node 110. In a non-limiting example, an entity 112 may be a lawyer, a firm, a client, or a digital platform, each represented by a virtual node 110 with associated attributes and behaviors.

With continued reference to FIG. 1, the at least a processor 102 may be further configured to generate the digital twin 106 by defining at least an objective 116 of the digital twin 106, collecting operational data 118 associated with the plurality of nodes and an environment 124, generating, using a machine learning model, the digital twin 106 as a function of the operational data 118, and updating, using one or more data streams 120, the digital twin 106 wherein the one or more data streams 120 provide new operational data 122 associated with the plurality of nodes and the environment 124. As used in this disclosure, an "objective" is a defined goal that the digital twin 106 is configured to evaluate. In a non-limiting example, an objective 116 may include improving overall firm efficiency by testing different staffing models. An objective 116 may include enhancing client outcomes by simulating the impact of assigning different resources to client matters. An objective 116 may further include reducing operational bottlenecks by analyzing how changes in resource allocation affect workflow. As used in this disclosure, "operational data" is data that characterizes the state or behavior of nodes or entities 114 within a system. In a non-limiting example, operational data 118 may include case completion times for attorneys in the firm. Operational data 118 may include workload levels across practice groups. Without limitation, operational data 118 may include success rates associated with prior resource assignments. As used in this disclosure, an "environment" is the context, conditions, or external factors in which the plurality of nodes operate. Without limitation, the environment 124 may influence or constrain the nodes 108 behaviors. In a non-limiting example, the environment 124 may include the volume of client demand received by the firm. The environment 124 may also include external deadlines imposed by courts or regulators. The environment 124 may further include organizational structures such as reporting lines within the firm. As used in this disclosure, a "machine learning model" is a computational model that uses training data to learn patterns, rules, or functions. Without limitation, the machine learning model may generate predictions or classifications when applied to new data. In a non-limiting example, a machine learning model may learn how attorney experience levels affect case outcomes. The machine learning model may also predict workload distribution across practice areas. The machine learning model may further generate estimated timelines for case resolution under different staffing conditions. Without limitation, the machine learning model may be described in more detail in FIG. 2. As used in this disclosure, a "data stream" is a sequential flow of data values provided from one or more sources into the system in real time or near-real time. In a non-limiting example, a data stream 120 may include daily updates of hours billed by attorneys. A data stream 120 may also include real-time intake of new client matters. A data stream 120 may further include updated client feedback scores captured after engagements. As used in this disclosure, "new operational data" is operational data received after the digital twin 106 has been generated, which may be used to update or refine the digital twin 106. In a non-limiting example, new operational data 122 may include recent changes in attorney availability. New operational data 122 may also include updated success metrics following completed matters. New operational data 122 may further include newly observed client demand trends. In an embodiment, an objective 116 of the digital twin 106 may include improving firm efficiency by testing staffing models, enhancing client outcomes by simulating different resource assignments, or reducing bottlenecks by evaluating how workflow changes affect matter completion. In an embodiment, operational data 118 may include information such as case completion times, workload levels across practice groups, and historical success rates of assignments. In an embodiment, the environment 124 may include the overall level of client demand, deadlines imposed by courts or regulators, and structural reporting lines within the firm. In an embodiment, the machine learning model may be configured to learn patterns such as the relationship between attorney experience and case outcomes, predict workload distribution across departments, or estimate timelines for resolution of matters under different resource configurations. In an embodiment, the one or more data streams 120 may include real-time updates of billable hours, intake of new client matters, client feedback scores following engagements, and the like. In an embodiment, new operational data 122 may include recent changes in attorney availability, updated success metrics following completed matters, or revised client demand trends that affect the representation of the digital twin 106 of the firm.

Still referring to FIG. 1, processor 102 is configured to determine a first scenario 128 of a plurality of scenarios 126 comprising one or more candidate nodes 130, wherein each candidate node 136 is assigned a role 132 of a plurality of roles 134 within the digital twin 106. As used in this disclosure, a "scenario" is a defined configuration, condition, or set of circumstances applied to a digital twin 106 for the purpose of testing, evaluating, or predicting outcomes. In a non-limiting example, a scenario may include assigning new responsibilities to resources to evaluate efficiency changes. A scenario may include introducing an external factor such as increased workload to observe system responses. A scenario may include rearranging relationships among nodes 108 to analyze effects on performance. As used in this disclosure, a "candidate node" is a virtual node selected or introduced into a scenario of the digital twin 106, wherein the candidate node 136 is associated with an entity 112. Without limitation, the candidate node 136 may be evaluated for its behavior, performance, or compatibility under one or more scenarios. In a non-limiting example, a candidate node 136 may represent an attorney being considered for a new assignment. A candidate node 136 may represent a new client matter being introduced into the workflow. A candidate node 136 may represent a technology system added to support operations. As used in this disclosure, a "role" is a functional position, assignment, or responsibility designated to a node 110 within a digital twin 106, wherein the role 132 governs the behavior, interactions 152, or constraints applied to the node 110 during a scenario. In a non-limiting example, a role 132 may include case manager, team leader, or supporting contributor. A role 132 may include administrative or technical responsibilities within the digital twin 106. A role 132 may further include specialized functions such as advisor, reviewer, coordinator, and the like.

With continued reference to FIG. 1, the processor 102 may be configured to determine a first scenario 128 of a plurality of scenarios 126, wherein the first scenario 128 may include one or more candidate nodes 130. Each candidate node 136 may be assigned a role 132 selected from a plurality of roles 134 defined within the digital twin 106. In an embodiment, the scenario may involve introducing new candidate nodes 130 into the digital twin 106 or reassigning existing nodes to alternative roles 134, thereby allowing the processor 102 to simulate different organizational structures, functional responsibilities, or interaction conditions. Through this mechanism, the digital twin 106 may be dynamically adapted to explore the outcomes of alternative configurations and to support predictive analysis across multiple possible futures.

With continued reference to FIG. 1, each candidate node 136 may be associated with a third party 138 of a plurality of third parties 140 and each candidate node 136 comprises third party data associated with the corresponding third party 138. As used in this disclosure, a "third party" is an external individual, organization, system, or other entity 112 that is not part of the primary system. In an embodiment, the third party 138 may interact with or be represented within the digital twin 106. In a non-limiting example, a third party 138 may include an outside consultant considered for participation in a project. Without limitation, the third party 138 may include a client organization represented in the digital twin 106 for purposes of simulating engagements. A third party 138 may include a technology service provider linked to the system through data exchange. In an embodiment, this configuration may allow external participants to be represented within the digital twin 106 through candidate nodes 130, thereby extending simulations beyond the internal entities 114 of the system. The association of candidate nodes 130 with third parties 140 may enable the apparatus 100 to incorporate external data and roles 134 into scenarios 126, such as evaluating the impact of engaging a new consultant, introducing a new client matter, integrating a third-party platform, and the like. In an embodiment, the processor 102 may instantiate a candidate node 136 in the digital twin 106 and assign it a unique identifier that links to a third-party record stored in a database. The third-party record may include structured data fields such as capabilities, historical performance, availability, and the like, which are loaded into the candidate node 136 as attributes. The processor 102 may bind these attributes to operational metrics 156 of the candidate node 136 so that they can participate in mapping, comparison, and scoring processes during simulation. This association may be facilitated through relational database joins, graph database edges, or API integrations that connect external third-party data sources with the digital twin 106. Once associated, the candidate node 136 may be treated as an active representation of the third party 138, enabling the apparatus 100 to simulate interactions 152, test roles 134, and evaluate outcomes under various scenarios 126.

Still referring to FIG. 1, processor 102 is configured to integrate the first scenario 128 with the digital twin 106. In an embodiment, the integration process may include instantiating candidate nodes 130 within the digital twin 106 and assigning them defined roles 134. The processor 102 may update the data structures of the digital twin 106 to reflect these candidate nodes 130. Without limitation, this may include linking them to existing nodes 108 through relationships, constraints, or dependencies. The integration may include mapping attributes of the candidate nodes 130, such as operational metrics 156, into the variable space of the digital twin 106 so that they can participate in subsequent simulation steps. Without limitation, the integration may involve updating adjacency lists, graph databases, or rule-based engines that underlie the digital twin 106 so that the candidate nodes 130 are fully embedded into the system's computational framework. This integration may ensure that when simulations are executed, the candidate nodes 130 interact dynamically with existing nodes according to their assigned roles 134 and associated rules, enabling the processor 102 to evaluate the effects of the new scenario on the overall system.

Still referring to FIG. 1, processor 102 is configured to calculate, using an AI simulator 142, scores 144 corresponding to a plurality of variables 146 associated with the integration of the first scenario 128 and the digital twin 106, wherein the AI simulator 142 propagates learned parameters 148 through the digital twin 106. As used in this disclosure, an "AI simulator" is a computational engine that applies artificial intelligence model(s). Without limitation, the Ai simulator 142 may execute simulations, generate predictions, evaluate outcomes within a digital twin 106, and the like. In a non-limiting example, an AI simulator 142 may run different staffing configurations through a digital twin 106 of a firm to observe impacts on workload distribution. In an embodiment, the AI simulator 142 may evaluate how new third-party resources alter performance across the system. In an embodiment, the AI simulator 142 may apply learned models to predict the likelihood of success for different organizational structures. As used in this disclosure, a "score" is a numerical value generated by a computational process that represents the outcome, evaluation, or degree of alignment of one or more variables within a simulation. In a non-limiting example, a score 144 may represent the predicted effectiveness of assigning a resource to a client matter. A score 144 may also indicate the degree of compatibility between a candidate node 136 and an existing node in the digital twin 106. A score 144 may quantify the likelihood of achieving a desired operational outcome under a given scenario. As used in this disclosure, a "variable" is a measurable or computational element whose value is determined, updated, or predicted during a simulation. In a non-limiting example, a variable 146 may represent case completion time. A variable 146 may also represent client satisfaction levels. A variable 146 may further represent predicted workload balance across attorneys. As used in this disclosure, "learned parameters" are numerical values, weights, or rules acquired through the calibration of a model that govern how the AI simulator 142 processes input data and simulates interactions 152. In a non-limiting example, learned parameters 148 may weigh more heavily than availability when predicting assignments. Without limitation, the learned parameters 148 may adjust the importance of past case outcomes compared to resource experience. Learned parameters 148 may encode interaction rules that shape how candidate nodes 130 behave in the digital twin 106.

With continued reference to FIG. 1, processor 102 is configured to calculate, using an AI simulator 142, scores 144 corresponding to a plurality of variables 146 associated with the integration of the first scenario 128 and the digital twin 106, wherein the AI simulator 142 propagates learned parameters 148 through the digital twin 106. In an embodiment, this calculation may include instantiating the candidate nodes 130 with their assigned roles 134, applying learned parameters 148 to govern how those nodes interact with other nodes 154, and updating variables 146 based on observed outcomes 188 in the simulation. The propagation of learned parameters 148 may allow the AI simulator 142 to weight operational metrics 156, prioritize certain interactions 152, adjust the sensitivity of outcomes, and the like, ensuring that the resulting scores 144 reflect both the raw data of the digital twin 106 and patterns derived from prior training. Continuing, the scores 144 may serve as quantitative indicators of alignment, performance, or risk associated with the integrated scenario. In a non-limiting example, the first scenario 128 may include instantiating a candidate node 136 representing a new associate attorney and assigning that node the role 132 of case manager for a client matter. The AI simulator 142 may propagate learned parameters 148 such that experience level is weighted more heavily than availability, reflecting prior training data indicating that experience is the strongest predictor of positive outcomes. Variables 146 tracked in the simulation may include predicted case completion time, workload distribution balance, and client satisfaction probability. The AI simulator 142 may then generate scores 144 corresponding to these variables 146, such as a predicted case completion time score of 0.87, a workload balance score of 0.81, and a client satisfaction score of 0.92. These scores 144 may be used by the apparatus 100 to evaluate the viability of the candidate node 136 in the assigned role and to compare alternative scenarios 126 within the digital twin 106. In a second scenario, the same candidate node 136 may instead be assigned the role 132 of supporting contributor rather than case manager. The AI simulator 142 may propagate learned parameters 148 that place less emphasis on leadership experience and more emphasis on availability, reflecting how contributors affect outcomes differently. The resulting variables 146 may again include case completion time, workload balance, and client satisfaction, but the generated scores 144 may differ, such as a case completion score of 0.75, a workload balance score of 0.89, and a client satisfaction score of 0.84. Comparing these scenarios 126, the apparatus 100 may determine that the candidate node 136 is more effective as a case manager for the specific client matter, based on the higher aggregate scores 144.

With continued reference to FIG. 1, the at least a processor 102 may be further configured to calculate, using the AI simulator 142, the scores 144 by instantiating the one or more candidate nodes 130 as agents 150 within the digital twin 106, simulating interactions 152 of the agents 150 with other nodes 154 according to the learned parameters 148, mapping a plurality of operational metrics 156 of the one or more candidate nodes 130 to corresponding operational metrics 156 of the plurality of virtual nodes 108 of the digital twin 106, comparing the mapped operational metrics 156, identifying a degree of concordance 158 of the mapped operational metrics 156, and assigning a score of the scores 144 to each variable of the plurality of variables 146 associated with the integration. As used in this disclosure, "agents" are virtualized computational representations of entities 114 that execute behaviors, make decisions, and interact with other nodes 154 according to rules or parameters within a digital twin 106. In a non-limiting example, an agent 150 may perform actions such as accepting tasks, reallocating effort, or requesting resources based on local state. An agent 150 may also adapt its behavior in response to learned parameters 148 that adjust thresholds for taking actions. An agent 150 may further exchange messages with other nodes 154 to coordinate activity under scenario constraints. As used in this disclosure, "operational metrics" are measurable attributes that quantify the state, performance, or behavior of nodes or agents 150 and are usable as inputs to comparisons, mappings, or scoring. In a non-limiting example, an operational metric may capture processing time required to complete a task. An operational metric may quantify resource utilization such as capacity consumed during an interval. An operational metric may encode quality signals such as an outcome score derived from prior executions. As used in this disclosure, a "degree of concordance" is a quantified measure indicating the extent to which two sets of operational metrics 156 agree under a defined comparison. In a non-limiting example, a degree of concordance 158 may be expressed as a similarity score normalized to a unit interval. A degree of concordance 158 may be computed as a weighted aggregation that emphasizes selected metrics. A degree of concordance 158 may reflect penalties for conflicts or constraint violations observed during comparison.

With continued reference to FIG. 1, the instantiation process may include allocating in-memory structures for candidate nodes 130, assigning role identifiers, attaching behavior policies, binding learned parameters 148 to agent 150 controllers so that actions can be produced deterministically from state and input, and the like. The processor 102 may register each instantiated agent 150 in a graph-backed index, update routing tables for inter-node messaging, and attach time-step schedulers so that agent 150 actions can be advanced discretely or continuously. As used in this disclosure, a "graph-backed index" is a data structure that organizes nodes and their relationships using graph representations. Without limitation, graph representations may include adjacency lists, edge tables, linked references, and the like, and may enable efficient lookup and traversal of connections within a digital twin 106. In a non-limiting example, a graph-backed index may store the relationships between attorneys and client matters in a legal services simulation. A graph-backed index may allow rapid queries to identify all matters linked to a particular attorney node. A graph-backed index may support traversal of the network to trace dependencies between resources and outcomes. As used in this disclosure, "routing tables for inter-node messaging" are structured records that specify how communication, data, or events are directed between nodes or agents 150 in a simulation environment. In a non-limiting example, a routing table may define that a message from an associate agent 150 about task completion is delivered to a supervising attorney node. A routing table may manage broadcasts where an update is shared with all nodes linked to a client matter. A routing table may further handle conditional routing so that only relevant nodes receive workload alerts. As used in this disclosure, a "time-step scheduler" is a computational mechanism that coordinates the execution of agent 150 actions in discrete intervals or continuous progression, ensuring that events and interactions 152 occur in a logically ordered sequence during simulation. In a non-limiting example, a time-step scheduler may advance the state of all attorney agents 150 by one simulated day to evaluate case progress. A time-step scheduler may allow continuous updates where client demand streams are ingested in real time. A time-step scheduler may further synchronize multiple processes so that resource assignments, task completions, and feedback updates remain consistent across the digital twin 106. Role-specific rule sets and constraint handlers may be loaded from a policy store and compiled into executable forms such as decision graphs or finite state machines, enabling agents 150 to query neighbor states, consume events from a queue, and emit state transitions to the digital twin 106 during simulation.

With continued reference to FIG. 1, the mapping process may include normalizing operational metrics 156 to a common schema, aligning units and scales, and resolving identifiers so that candidate-agent metrics correspond to metrics of virtual nodes 108 in the twin. As used in this disclosure, a "common schema" is a standardized organizational structure for data that defines consistent formats, fields, and relationships so that heterogeneous inputs can be uniformly represented and processed within a system. In a non-limiting example, a common schema may define that all attorney workload data is represented with fields for hours, matter type, and completion status. A common schema may ensure that client feedback data and performance metrics share standardized rating scales. A common schema may further allow data from multiple systems to be merged into the digital twin 106 without conflicts in naming or structure. The processor 102 may employ a schema registry and ontology to map metric names, vectorize metric bundles into aligned feature vectors, and store them in a feature store or vector index to support fast retrieval and comparison. As used in this disclosure, a "schema registry" is a repository or service that stores and manages data schemas to ensure that producers and consumers of data share a consistent structure for interpretation and processing. In a non-limiting example, a schema registry may store the agreed format for reporting attorney hours across different practice groups. A schema registry may manage versioning so that updated performance metrics can still be read by older processes. A schema registry may further enforce validation rules to prevent malformed data from entering the digital twin 106. As used in this disclosure, an "ontology" is a formal specification of concepts and relationships within a domain, providing a semantic framework for aligning terms, categories, and data elements. In a non-limiting example, an ontology may define how the concept of "case" relates to "matter," "attorney," and "client" within the digital twin 106. An ontology may ensure that workload metrics and success rates are correctly associated with the right entities 114. An ontology may enable reasoning across the system, such as inferring that an associate assigned to a client matter contributes indirectly to client satisfaction. As used in this disclosure, "vectorizing metric bundles" is the process of transforming grouped operational metrics 156 into ordered numerical arrays so they can be processed using mathematical or machine learning models. In a non-limiting example, vectorizing may convert an attorney's workload, experience, and satisfaction scores 144 into a fixed-length numeric vector. Vectorizing may also encode client feedback and case complexity ratings into aligned feature sets for similarity analysis. Vectorizing may further allow multiple types of data to be compared directly by embedding them into a shared numerical space. Data transformation components may include parsers for structured payloads, unit converters, imputation modules for missing values, and encoders that produce standardized numeric representations suitable for downstream similarity calculations.

With continued reference to FIG. 1, the identifying process for the degree of concordance 158 may include computing pairwise similarity or distance across mapped metric vectors, aggregating results with learned weights, and applying constraint-aware adjustments that reflect rule satisfaction. The processor 102 may calculate cosine similarity, Mahalanobis distance, or correlation-based measures across metric dimensions, apply weighting coefficients derived from learned parameters 148, and produce a scalar concordance value per comparison. Post-processing may include thresholding to discard weak matches, calibration using held-out residuals to correct score bias, and confidence estimation based on variance of metric measurements or uncertainty propagated from the mapping stage.

Still referring to FIG. 1, processor 102 is configured to generate a predicted output 160 as a function of the integration and the scores 144. As used in this disclosure, a "predicted output" is a computational result generated by the system that estimates a future state, condition, or outcome as a function of integrated scenarios 126 and associated scores 144 within a digital twin 106. In a non-limiting example, a predicted output 160 may include an estimated case completion time for a client matter. A predicted output 160 may include a probability of client satisfaction under a given staffing configuration. A predicted output 160 may further include a projection of workload balance across attorneys following assignment changes. In an embodiment, the processor 102 may aggregate scores 144 corresponding to variables 146 such as workload distribution, task completion time, or satisfaction probability, and combine them into a structured predicted output 160. The predicted output 160 may be expressed as a data object, record, or vector that represents how the system is expected to perform under the integrated scenario. The generation of the predicted output 160 may involve applying weighting rules, normalizing scores 144, resolving conflicts between variables 146 to produce a consistent result, and the like. The processor 102 may normalize the scores 144 so that they are expressed on a consistent scale, apply weighting factors to emphasize higher-priority variables 146, and resolve conflicts between overlapping values. The processor 102 may encode the resulting values into a predicted output 160 object that may take the form of a vector, matrix, or structured record. This object represents the system's projected behavior under the integrated scenario and may be stored in memory, transmitted to a downstream model 164, or displayed through a user interface 176 for further analysis. Without limitation, the result may be stored, transmitted, or forwarded for downstream use, including comparison of alternative scenarios

126, generation of recommendations, visualization 178 within a user interface 176, and the like.

With continued reference to FIG. 1, the predictive output may include one or more predicted operational outcomes 162. As used in this disclosure, a "predicted operational outcome" is a forecasted result of a process, action, or configuration within a system, generated through computational analysis of scenarios 126 and variables 146 in a digital twin 106. In a non-limiting example, a predicted operational outcome may include the projected duration of a client matter after resource reassignment. A predicted operational outcome may include the expected change in utilization levels across attorneys. A predicted operational outcome may include an anticipated improvement or decline in client satisfaction scores 144 under a simulated scenario.

With continued reference to FIG. 1, the at least a processor 102 may be further configured to transmit the predicted output 160 to a downstream model 164, wherein the downstream model 164 is configured to identify the one or more candidate nodes 130 from a candidate database 166. As used in this disclosure, a "downstream model" is a computational process that receives a predicted output 160 and performs subsequent analysis, selection, or decision-making to produce a further result. In a non-limiting example, a downstream model 164 may rank possible assignments based on the predicted output 160. A downstream model 164 may filter options using thresholds derived from policy rules. A downstream model 164 may further generate recommendations that reflect tradeoffs among variables 146 included in the predicted output 160. As used in this disclosure, a "candidate database" is a data store that maintains records describing candidate nodes 130 along with identifiers, attributes, and operational metrics 156 used for retrieval and evaluation. In a non-limiting example, a candidate database 166 may store profiles of external professionals available for engagement. A candidate database 166 may also record historical outcomes linked to each candidate node 136. A candidate database 166 may further expose indexed fields that enable rapid lookup by skill, availability, or performance indicators. In an embodiment, the processor 102 may serialize the predicted output 160 into a structured message, validate the schema against the interface of the downstream model 164, and dispatch the message through an internal bus or service endpoint. The downstream model 164 may receive the predicted output 160, parse variables 146 and scores 144, and issue indexed queries to the candidate database 166 that retrieve candidate nodes 130 matching required attributes and meeting score-derived thresholds. The downstream model 164 may then compute selection rankings using the retrieved candidate records and the values contained in the predicted output 160, and it may return identifiers of the one or more candidate nodes 130 for subsequent use in recommendation, visualization 178, or further simulation.

With continued reference to FIG. 1, the at least a processor 102 may be further configured to integrate a second scenario 170 with the digital twin 106, calculate, using the AI simulator 142, scores 144 corresponding to the plurality of variables 146 associated with the integration of the second scenario 170 and the digital twin 106, and generate one or more alternative predicted outputs 168 as a function of the integration and the scores 144. As used in this disclosure, an "alternative predicted output" is a computational result generated by applying a different scenario to a digital twin 106, wherein the result represents a distinct projection of outcomes relative to those of a previously integrated scenario. In a non-limiting example, an alternative predicted output may include a revised estimate of case completion time under a changed staffing configuration. An alternative predicted output may also include a different projection of workload balance after introducing new resource constraints. An alternative predicted output may further include a modified probability of client satisfaction when a new third party 138 is assigned to the matter. In an embodiment, this may be done by instantiating new candidate nodes 130, assigning them roles 134, and updating the data structures of the digital twin 106 to reflect the second scenario 170. The AI simulator 142 may then propagate learned parameters 148 across the updated relationships, recalculate variables 146 such as time, utilization, and satisfaction, and generate a new set of scores 144. The processor 102 may compile these scores 144 into an alternative predicted output that reflects the projected state of the system under the second scenario 170. Without limitation, the first scenario 128 may assign a candidate node 136 representing a new associate attorney as case manager, yielding a predicted output 160 with scores 144 of 0.87 for case completion time, 0.81 for workload balance, and 0.92 for satisfaction. The second scenario 170 may instead assign the same associate attorney as a supporting contributor, resulting in recalculated scores 144 of 0.75 for case completion time, 0.89 for workload balance, and 0.84 for satisfaction. These values may be compiled into an alternative predicted output, enabling direct comparison between scenarios 126 and supporting decisions about which configuration better meets organizational objectives 116.

With continued reference to FIG. 1, the at least a processor 102 may be further configured to generate a recommendation as a function of ranking a plurality of predictive outputs of the predictive output as a function of the scores 144 and user input 174. As used in this disclosure, a "recommendation" is a computationally generated suggestion or selection that reflects a ranked or prioritized outcome based on one or more predicted outputs 172, scores 144, or additional inputs. In a non-limiting example, a recommendation may include identifying the most effective resource for assignment. Without limitation, the recommendation may include prioritizing alternative predicted outputs 168 according to organizational objectives 116. A recommendation may further include proposing adjustments to scenarios 126 to optimize outcomes. As used in this disclosure, "user input" is data provided by a human or system operator through an interface that influences how predictions, rankings, or recommendations are generated. In a non-limiting example, user input 174 may include weighting client satisfaction more heavily than cost efficiency. User input 174 may also include specifying constraints such as maximum workload per individual. User input 174 may further include selecting a preference for one type of outcome visualization 178 over another. In an embodiment, the processor 102 may compile predicted outputs 172 generated from multiple scenarios 126, normalize the associated scores 144, and rank them in accordance with thresholds, weights, or priorities specified by the user input 174. The recommendation may be produced by applying ranking algorithms such as weighted scoring, multi-criteria optimization, or rule-based sorting to the outputs, resulting in a prioritized set of options. This recommendation may then be provided to the operator through a user interface 176, enabling the operator to review system-derived priorities that incorporate both quantitative scores 144 and qualitative user-defined preferences.

With continued reference to FIG. 1, the at least a processor 102 may be further configured to display, using a user interface 176, a visualization 178 corresponding to the predicted output, wherein the visualization 178 comprises a graphical representation 180 of the plurality of scenarios 126 and a simulation timeline 182. As used in this disclosure, a "user interface" is a medium through which a user interacts with a system to provide input, receive output, or manipulate data and visualizations 178. In a non-limiting example, a user interface 176 may include a dashboard that displays simulation results. A user interface 176 may also allow entry of parameters that influence scenario generation. A user interface 176 may further provide interactive elements for exploring predicted outputs 172.

Without limitation, the user interface 176 may include a graphical user interface. A "graphical user interface," as used herein, is a graphical form of user interface that allows users to interact with electronic devices. In some embodiments, GUI may include icons, menus, other visual indicators or representations (graphics), audio indicators such as primary notation, and display information and related user controls. A menu may contain a list of choices and may allow users to select one from them. A menu bar may be displayed horizontally across the screen such as pull-down menu. When any option is clicked in this menu, then the pull-down menu may appear. A menu may include a context menu that appears only when the user performs a specific action. An example of this is pressing the right mouse button. When this is done, a menu may appear under the cursor. Files, programs, web pages and the like may be represented using a small picture in a graphical user interface. For example, links to decentralized platforms as described in this disclosure may be incorporated using icons. Using an icon may be a fast way to open documents, run programs etc. because clicking on them yields instant access.

With continued reference to FIG. 1, in an embodiment, the graphical user interface and an event handler may operate together to enable seamless interaction between the user and the apparatus 100. The GUI serves as the visual and interactive layer through which the user engages with the apparatus 100, presenting elements such as buttons, sliders, input fields, and informational displays. The event handler, on the other hand, functions as the underlying mechanism that monitors and responds to user interactions with the GUI. For example, when a user clicks a button on the GUI to request an explanation of a concept, the event handler may detect the click event, identify its context, and trigger the appropriate processes within the apparatus 100 to generate a tailored response. This interplay may ensure dynamic and responsive system behavior, as the event handler processes various input events such as clicks, taps, keystrokes, or voice commands, and relays these inputs to the relevant system components. The GUI subsequently updates to reflect the system's responses, such as displaying output, modifying visual elements, or providing real-time feedback. Together, the GUI and event handler create an intuitive and interactive experience, bridging user actions and system functionality to achieve efficient and personalized outcomes.

With continued reference to FIG. 1, an "event handler," as used in this disclosure, is a module, data structure, function, and/or routine that performs an action in response to an event. For instance, and without limitation, an event handler may record data corresponding to user selections of previously populated fields such as drop-down lists and/or text auto-complete and/or default entries, data corresponding to user selections of checkboxes, radio buttons, or the like, potentially along with automatically entered data triggered by such selections, user entry of textual data using a keyboard, touchscreen, speech-to-text program, or the like.

Event handler may generate prompts for further information, may compare data to validation rules such as requirements that the data in question be entered within certain numerical ranges, and/or may modify data and/or generate warnings to a user in response to such requirements.

With continued reference to FIG. 1, as used in this disclosure, a "visual element" is a component or feature within a system, display, or interface that conveys information through visual means. In a non-limiting example, the visual element may include text, images, icons, shapes, colors, and/or other graphical components designed to be perceived by the user. In a non-limiting example, the visual element may aid in communication, navigation, and/or interaction with the system. Without limitation, the visual element may be used to enhance user experience, guide behavior, and/or represent data visually in an intuitive or informative way. A visual element may include data transmitted to display device, client device, and/or graphical user interface. In some embodiments, visual element may be interacted with. For example, visual element may include an interface, such as a button or menu. In some embodiments, visual element may be interacted with using a user device such as a smartphone, tablet, smartwatch, or computer.

With continued reference to FIG. 1, in an embodiment, the apparatus 100 and or the downstream device may include a data structure. As used in this disclosure, "data structure" is a way of organizing data represented in a specialized format on a computer configured such that the information can be effectively presented in a graphical user interface. In some cases, the data structure includes any input data. In some cases, the data structure contains data and/or rules used to visualize the graphical elements within a graphical user interface. In some cases, the data structure may include any data described in this disclosure. In some cases, the data structure May be configured to modify the graphical user interface, wherein data within the data structure may be represented visually by the graphical user interface. In some cases, the data structure may be continuously modified and/or updated by processor 102, wherein elements within graphical user interface may be modified as a result. In some cases, processor 102 may be configured to transmit display device and or the downstream device the data structure. Transmitting may include, and without limitation, transmitting using a wired or wireless connection, direct, or indirect, and between two or more components, circuits, devices, systems, and the like, which allows for reception and/or transmittance of data and/or signal(s) therebetween. Data and/or signals there between may include, without limitation, electrical, electromagnetic, magnetic, video, audio, radio, and microwave data and/or signals, combinations thereof, and the like, among others. Processor 102 may transmit the data described above to a database wherein the data may be accessed from the database. Processor 102 may further transmit the data above to a display device, client device, or another computing device. The data structure may serve as the organizational framework that stores, retrieves, and manages data required for processing events and updating the GUI. The data structure may act as a bridge between the user's input, captured by the event handler, and the output displayed on the GUI, ensuring that information is handled efficiently and accurately throughout the interaction. For example, without limitation, when a user interacts with a dropdown menu in the GUI to select a topic, the event handler may capture this input and accesses a data structure. The data structure may retrieve the relevant information such as, text explanations, videos, or interactive exercises, and passes it back to the event handler, which may then trigger the appropriate updates to the GUI. In another embodiment, the data structure may also maintain the state of the system, tracking user progress, preferences, and session history. For instance, without limitation, a hash table may store user specific configurations which the event handler references when processing interactions. The GUI may then dynamically adapt to display content aligned with these configurations. This integration may ensure that user inputs are seamlessly translated into meaningful system outputs, with the data structure enabling rapid access, consistency, and scalability throughout the process. As used in this disclosure, a "hash table" is a data structure that stores data in a way that allows for fast retrieval, insertion, and deletion of elements. The hash table may organize data into key-value pairs, where each key is unique and used to identify its corresponding value. A hash table may use a hash function to compute an index, or hash code, from the key, which determines where the key-value pair is stored within an array or list.

With continued reference to FIG. 1, as used in this disclosure, an "interactive element" is a component or feature within a graphical user interface (GUI) that allows users to perform actions, provide input, or engage with the apparatus 100. Interactive elements may be designed to facilitate two-way communication between the user and the system, enabling the user to influence the behavior of the apparatus or obtain feedback in response to their actions. Examples of interactive elements may include buttons, dropdown menus, sliders, checkboxes, input fields, and hyperlinks. More advanced interactive elements may include drag-and-drop interfaces, interactive diagrams, or dynamically updating content areas that respond to user actions in real time. The interactive elements may enhance user engagement by providing intuitive and responsive mechanisms for interacting with the system. Interactive elements may operate by responding to user actions such as clicks, taps, swipes, or keyboard inputs, and triggering predefined system behaviors or processes. The execution of the interactive elements may require a combination of front-end and back-end technologies that work together to provide seamless functionality and user interaction. On the front end, technologies such as HTML and CSS may define the structure, appearance, and layout of the interactive elements, while JavaScript may enable dynamic functionality. For example, without limitation, JavaScript may detect when the user clicks a button and trigger actions or animations. Front-end frameworks like React, Angular, or Vue.js may further enhance development by offering reusable components and efficient rendering mechanisms. On the back end, the system may process the user's input, retrieve the necessary data, and communicate with the front end to provide an appropriate response. APIs may act as a bridge between the front end and back end, facilitating data transfer, such as sending a user's form submission to the server and retrieving processed results. Server-side logic, implemented using languages like Python, Java, or Node.js, may handle input processing and return relevant data. Additional supporting technologies may ensure the smooth operation of interactive elements. Event listeners, for instance, may continuously monitor for specific actions like mouse clicks or text entries, executing code when such events are detected. Efficient data structures, such as hash tables or dictionaries, may store interactive state data, such as user preferences or settings, for quick access and updates. Databases, including MySQL or MongoDB, may manage and store the data required for interactive features, such as user profiles or historical activity. Communication technologies may also help maintain the responsiveness of interactive elements. AJAX (Asynchronous Javascript and XML) may allow the front end to update portions of a web page without requiring a full page reload, enhancing responsiveness. WebSockets may provide real-time interaction capabilities, such as live chats or collaborative tools, by enabling persistent communication between the client and the server. Without limitation, the apparatus 100 may include one or more APIs. As used in this disclosure, an "application programming interface (API)" is a set of defined protocols, tools, and methods that allow different software applications, systems, or components to communicate and interact with each other. An API may act as an intermediary that enables a client application, such as a user-facing app, to send requests to a server or service and receive the necessary responses, facilitating seamless integration and functionality across diverse systems.

With continued reference to FIG. 1, as used in this disclosure, "downstream device" is a device that accesses and interacts with apparatus 100. For instance, and without limitation, downstream device may include a remote device and/or apparatus 100. In a non-limiting embodiment, downstream device may be consistent with a computing device as described in the entirety of this disclosure. Without limitation, the downstream device may include a display device. As used in this disclosure, a "display device" refers to an electronic device that visually presents information to the entity 112. In some cases, display device may be configured to project or show visual content generated by computers, video devices, or other electronic mechanisms. In some cases, display device may include a liquid crystal display (LCD), a cathode ray tube (CRT), a plasma display, a light emitting diode (LED) display, and any combinations thereof. In a non-limiting example, one or more display devices may vary in size, resolution, technology, and functionality. Display device may be able to show any data elements and/or visual elements as listed above in various formats such as, textural, graphical, video among others, in either monochrome or color. Display device may include, but is not limited to, a smartphone, tablet, laptop, monitor, tablet, and the like. Display device may include a separate device that includes a transparent screen configured to display computer generated images and/or information. In some cases, display device may be configured to present a graphical user-interface (GUI) to a user, wherein a user may interact with a GUI. In some cases, a user may view a GUI through display. Additionally, or alternatively, processor 102 be connected to display device. In one or more embodiments, transmitting the predicted output 160 may include displaying the predicted output 160 at display device using a visual interface.

With continued reference to FIG. 1, as used in this disclosure, a "visualization" is a rendered output that conveys data, predictions, or system states in a form that is perceivable and interpretable by a user. In a non-limiting example, a visualization 178 may depict workload balance across resources. A visualization 178 may illustrate predicted case completion times for multiple scenarios 126. A visualization 178 may display confidence intervals around predicted outputs. As used in this disclosure, a "graphical representation" is a visual depiction of information using charts, plots, diagrams, or other image-based forms rather than text or numeric tables. In a non-limiting example, a graphical representation 180 may include a bar chart showing scenario performance. A graphical representation 180 may also include a network diagram of nodes and their relationships. A graphical representation 180 may further include a heatmap of similarity scores across candidate nodes 130. As used in this disclosure, a "simulation timeline" is an ordered sequence that displays the progression of simulated events or outcomes across defined time intervals. In a non-limiting example, a simulation timeline 182 may show how workload shifts across attorneys over weeks. A simulation timeline 182 may also display case progress from initiation to closure under different staffing configurations. A simulation timeline 182 may further illustrate changes in client satisfaction levels across the duration of a simulated engagement. In an embodiment, the processor 102 may generate a visualization 178 that includes side-by-side graphical representations 180 of multiple scenarios 126, each scenario rendered as a distinct pane or panel within the user interface 176. Each graphical representation 180 may display comparative workload distributions across candidate nodes 130, predicted task completion times, and satisfaction probabilities calculated from the integration and scoring process. The processor 102 may normalize these values to a consistent scale and encode them as visual elements such as bar charts for workload, line plots for completion time, and gauges or probability curves for satisfaction. The visualization 178 may further include a simulation timeline 182 that plots the evolution of these variables 146 across discrete time steps or in continuous form, depending on whether the simulation is event-driven or time-driven. For example, the simulation timeline 182 may advance in daily increments to show how workloads shift among attorneys, or it may update in real time as new operational data 122 streams into the system. The timeline may be aligned across scenarios 126 so that a user can directly compare how predicted outputs diverge at the same time points under different configurations. The user interface 176 may render this visualization 178 interactively, allowing a user to select a variable of interest, hover over timeline points to view exact values, or toggle between scenarios 126 for focused analysis. Interaction controls may include sliders to adjust time intervals, dropdowns to filter variables 146, and checkboxes to enable or disable candidate nodes 130. The interface may also support parameter adjustment, enabling a user to re-weight satisfaction versus workload or to introduce new constraints, after which the processor 102 may recompute predicted outputs 172 and refresh the visualization 178 dynamically. Through these mechanisms, the visualization 178 allows side-by-side scenario analysis, temporal exploration of predicted outputs, and iterative refinement of inputs in a closed analytical loop.

With continued reference to FIG. 1, the processor 102 may generate a visualization 178 that includes side-by-side graphical representations 180 of multiple staffing scenarios 126 for a client matter. In a first scenario 128, a candidate node 136 representing a junior associate is assigned the role 132 of case manager. The graphical representation 180 may show workload heavily concentrated on the junior associate, a predicted task completion timeline extending to 210 days, and a client satisfaction probability of 0.72. In a second scenario, the same matter is managed by a senior associate with the junior associate as a supporting contributor. The graphical representation 180 may display a more balanced workload across both attorneys, a reduced predicted completion time of 160 days, and a client satisfaction probability of 0.89. In a third scenario, a third-party consultant is added to the team alongside the senior associate and junior associate. The visualization 178 may reflect workload distributed across three resources, a predicted completion time of 140 days, and a client satisfaction probability of 0.93. The visualization 178 may further include a simulation timeline

182 spanning six months, with daily increments. The timeline may show how predicted workload allocation shifts from the senior associate to the consultant over the first month, how matter progress accelerates after week four, and how client satisfaction steadily rises as the project nears completion. The user interface 176 may render this visualization 178 interactively, allowing a user to hover over specific dates to view workload percentages per attorney, drag a slider to compare week-by-week performance across scenarios 126, and toggle weights to prioritize speed over satisfaction. Through this example, the system provides a detailed, side-by-side comparison of scenarios 126 with evolving outcomes over time, enabling informed decisions about resource assignment strategies.

With continued reference to FIG. 1, the at least a processor 102 may be further configured to calibrate the AI simulator 142 using historical operational data 184 associated with the plurality of nodes, wherein calibrating comprises adjusting node parameters 186 within the digital twin 106 to observed outcomes 188. As used in this disclosure, "historical operational data" is data collected from prior system activities, events, or processes that records the past states, behaviors, or performances of nodes or entities 114. In a non-limiting example, historical operational data 184 may include logs of case completion times from prior engagements. Historical operational data 184 may also include workload distributions previously recorded across attorneys. Historical operational data 184 may further include client satisfaction ratings observed in earlier matters. As used in this disclosure, "node parameters" are configurable attributes or values associated with a node 110 that govern its behavior, interactions 152, or performance within a digital twin 106. In a non-limiting example, node parameters 186 may include an attorney's maximum workload capacity. Node parameters 186 may also include response times for task completion. Node parameters 186 may further include thresholds for decision-making or escalation. As used in this disclosure, "observed outcomes" are measurable results recorded from real-world operations or prior simulations that reflect the actual performance or effects of node actions. In a non-limiting example, observed outcomes 188 may include the actual time taken to resolve a client matter. Observed outcomes 188 may also include the realized workload distribution across a legal team. Observed outcomes 188 may further include the level of client satisfaction following completion of services. In an embodiment, the calibration process may involve collecting historical operational data 184 from past engagements, aligning it with corresponding observed outcomes 188, and identifying discrepancies between predicted values and actual results. For instance, historical operational data 184 may indicate that junior associates typically completed research tasks in an average of 25 hours, while the prior predictions of the digital twin 106 assumed an average of 15 hours. The processor 102 may identify this discrepancy and adjust the node 110 parameter representing research task completion rate so that the simulation aligns with the observed 25-hour duration.

The processor 102 may further refine other node parameters 186 by comparing predicted workload thresholds against actual utilization levels recorded in historical data. If the digital twin 106 predicted that a senior associate could manage 12 active matters simultaneously but observed outcomes 188 show performance decline beyond 8 matters, the processor 102 may recalibrate the workload threshold parameter downward to reflect this limit. Similarly, if client satisfaction scores fall whenever more than two third-party consultants are introduced into a matter, the processor 102 may adjust interaction rules between consultant nodes and attorney nodes to encode this constraint. Through these adjustments, the calibration process allows the digital twin 106 to better reproduce the conditions seen in past engagements, ensuring that predicted outputs generated by the AI simulator 142 remain grounded in empirical evidence. Without limitation, by correcting biases and mismatches, the apparatus 100 may achieve higher fidelity in forecasting case completion times, workload distribution, and satisfaction probabilities. This ongoing calibration may enable future simulations to produce more reliable predictions that reflect both the theoretical design of the digital twin 106 and the realities of actual practice.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

Figure 2:
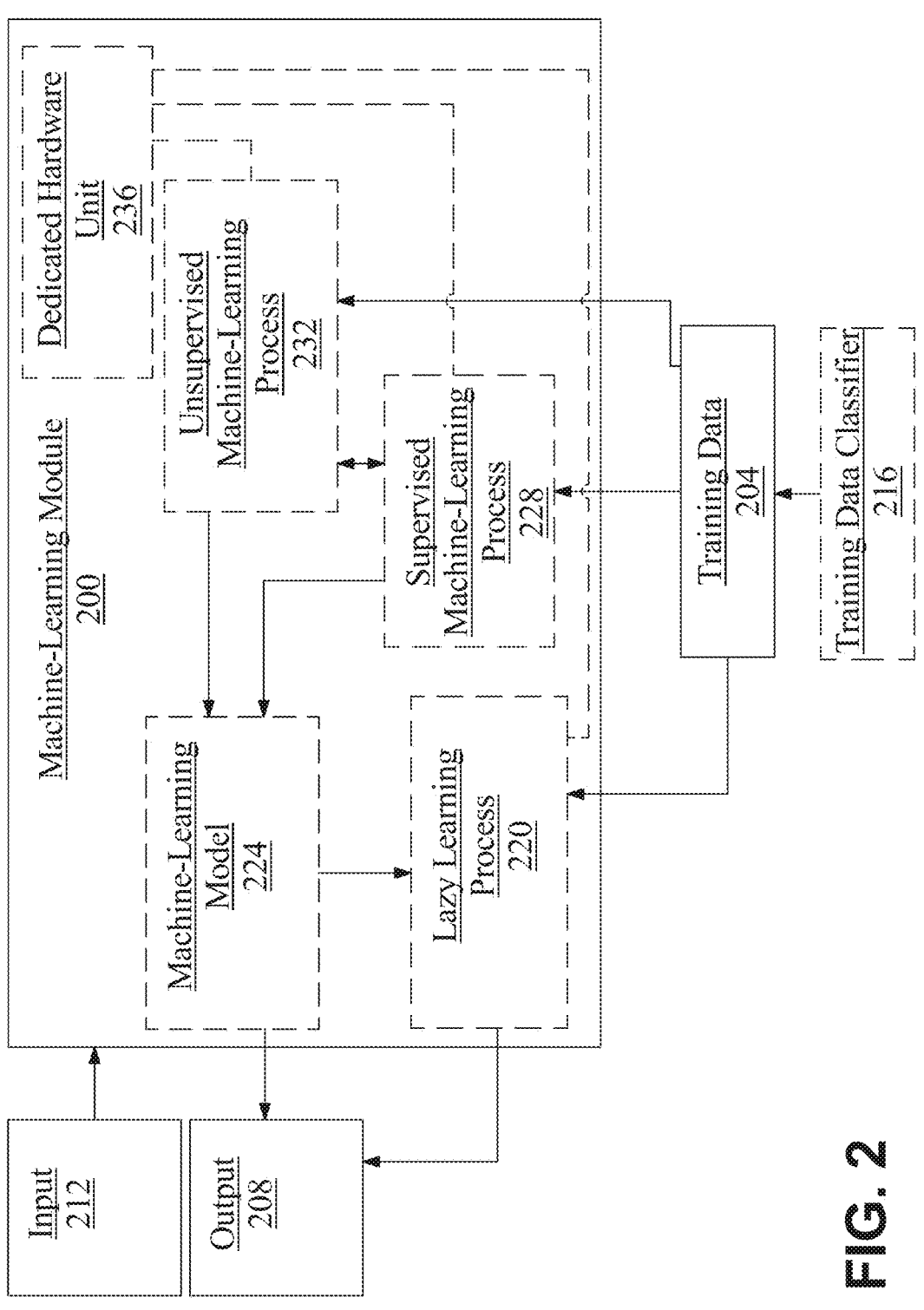
FIG. 2 is a block diagram of an exemplary machine-learning process.

Referring now to FIG. 2, an exemplary embodiment of a machine-learning module 200 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 204 to generate an algorithm instantiated in hardware or software logic, data structures, and/or functions that will be performed by a computing device/module to produce outputs 208 given data provided as inputs 212; this is in contrast to a non-machine learning software program where the commands to be executed are determined in advance by a user and written in a programming language.

Still referring to FIG. 2, "training data," as used herein, is data containing correlations that a machine-learning process may use to model relationships between two or more categories of data elements. For instance, and without limitation, training data 204 may include a plurality of data entries, also known as "training examples," each entry representing a set of data elements that were recorded, received, and/or generated together; data elements may be correlated by shared existence in a given data entry, by proximity in a given data entry, or the like. Multiple data entries in training data 204 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 204 according to various correlations; correlations may indicate causative and/or predictive links between categories of data elements, which may be modeled as relationships such as mathematical relationships by machine-learning processes as described in further detail below. Training data 204 may be formatted and/or organized by categories of data elements, for instance by associating data elements with one or more descriptors corresponding to categories of data elements. As a non-limiting example, training data 204 may include data entered in standardized forms by persons or processes, such that entry of a given data element in a given field in a form may be mapped to one or more descriptors of categories. Elements in training data 204 may be linked to descriptors of categories by tags, tokens, or other data elements; for instance, and without limitation, training data 204 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 2, training data 204 may include one or more elements that are not categorized; that is, training data 204 may not be formatted or contain descriptors for some elements of data. Machine-learning algorithms and/or other processes may sort training data 204 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 204 to be made applicable for two or more distinct machine-learning algorithms as described in further detail below. Training data 204 used by machine-learning module 200 may correlate any input data as described in this disclosure to any output data as described in this disclosure. As a non-limiting illustrative example, the input data may include a digital twin comprising at least a plurality of virtual nodes, wherein each node is associated with an entity of a plurality of entities. The corresponding output data may include a predicted output that represents the projected outcomes of integrating scenarios with the digital twin and calculating associated scores. Correlating these inputs and outputs may allow the machine-learning module to learn how changes in the structure, attributes, or interactions of virtual nodes influence the accuracy and reliability of predicted outputs.

Further referring to FIG. 2, training data may be filtered, sorted, and/or selected using one or more supervised and/or unsupervised machine-learning processes and/or models as described in further detail below; such models may include without limitation a training data classifier 216. Training data classifier 216 may include a "classifier," which as used in this disclosure is a machine-learning model as defined below, such as a data structure representing and/or using a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. A distance metric may include any norm, such as, without limitation, a Pythagorean norm. Machine-learning module 200 may generate a classifier using a classification algorithm, defined as a processes whereby a computing device and/or any module and/or component operating thereon derives a classifier from training data 204. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 216 may classify elements of training data to cohorts of entities represented in the digital twin, such as groups of attorneys, client organizations, or third-party consultants, for which a subset of training data may be selected. The classifier may also group training data according to operational conditions, such as high workload environments, complex case types, or resource-limited scenarios. Classifying elements of training data into such sub-populations may allow the system to generate models that are tuned for specific contexts and that provide more accurate predicted outputs.

Still referring to FIG. 2, Computing device may be configured to generate a classifier using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A) P(A)÷P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Computing device may then calculate a likelihood table by calculating probabilities of different data entries and classification labels. Computing device may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 2, Computing device may be configured to generate a classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 2, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

With further reference to FIG. 2, training examples for use as training data may be selected from a population of potential examples according to cohorts relevant to an analytical problem to be solved, a classification task, or the like. Alternatively or additionally, training data may be selected to span a set of likely circumstances or inputs for a machine-learning model and/or process to encounter when deployed. For instance, and without limitation, for each category of input data to a machine-learning process or model that may exist in a range of values in a population of phenomena such as images, user data, process data, physical data, or the like, a computing device, processor, and/or machine-learning model may select training examples representing each possible value on such a range and/or a representative sample of values on such a range. Selection of a representative sample may include selection of training examples in proportions matching a statistically determined and/or predicted distribution of such values according to relative frequency, such that, for instance, values encountered more frequently in a population of data so analyzed are represented by more training examples than values that are encountered less frequently. Alternatively or additionally, a set of training examples may be compared to a collection of representative values in a database and/or presented to a user, so that a process can detect, automatically or via user input, one or more values that are not included in the set of training examples. Computing device, processor, and/or module may automatically generate a missing training example; this may be done by receiving and/or retrieving a missing input and/or output value and correlating the missing input and/or output value with a corresponding output and/or input value collocated in a data record with the retrieved value, provided by a user and/or other device, or the like.

Continuing to refer to FIG. 2, computer, processor, and/or module may be configured to preprocess training data. "Preprocessing" training data, as used in this disclosure, is transforming training data from raw form to a format that can be used for training a machine learning model. Preprocessing may include sanitizing, feature selection, feature scaling, data augmentation and the like.

Still referring to FIG. 2, computer, processor, and/or module may be configured to sanitize training data. "Sanitizing" training data, as used in this disclosure, is a process whereby training examples are removed that interfere with convergence of a machine-learning model and/or process to a useful result. For instance, and without limitation, a training example may include an input and/or output value that is an outlier from typically encountered values, such that a machine-learning algorithm using the training example will be adapted to an unlikely amount as an input and/or output; a value that is more than a threshold number of standard deviations away from an average, mean, or expected value, for instance, may be eliminated. Alternatively or additionally, one or more training examples may be identified as having poor quality data, where "poor quality" is defined as having a signal to noise ratio below a threshold value. Sanitizing may include steps such as removing duplicative or otherwise redundant data, interpolating missing data, correcting data errors, standardizing data, identifying outliers, and the like. In a nonlimiting example, sanitization may include utilizing algorithms for identifying duplicate entries or spell-check algorithms.

As a non-limiting example, and with further reference to FIG. 2, images used to train an image classifier or other machine-learning model and/or process that takes images as inputs or generates images as outputs may be rejected if image quality is below a threshold value. For instance, and without limitation, computing device, processor, and/or module may perform blur detection, and eliminate one or more Blur detection may be performed, as a non-limiting example, by taking Fourier transform, or an approximation such as a Fast Fourier Transform (FFT) of the image and analyzing a distribution of low and high frequencies in the resulting frequency-domain depiction of the image; numbers of high-frequency values below a threshold level may indicate blurriness. As a further non-limiting example, detection of blurriness may be performed by convolving an image, a channel of an image, or the like with a Laplacian kernel; this may generate a numerical score reflecting a number of rapid changes in intensity shown in the image, such that a high score indicates clarity and a low score indicates blurriness. Blurriness detection may be performed using a gradient-based operator, which measures operators based on the gradient or first derivative of an image, based on the hypothesis that rapid changes indicate sharp edges in the image, and thus are indicative of a lower degree of blurriness. Blur detection may be performed using Wavelet-based operator, which takes advantage of the capability of coefficients of the discrete wavelet transform to describe the frequency and spatial content of images. Blur detection may be performed using statistics-based operators take advantage of several image statistics as texture descriptors in order to compute a focus level. Blur detection may be performed by using discrete cosine transform (DCT) coefficients in order to compute a focus level of an image from its frequency content.

Continuing to refer to FIG. 2, computing device, processor, and/or module may be configured to precondition one or more training examples. For instance, and without limitation, where a machine learning model and/or process has one or more inputs and/or outputs requiring, transmitting, or receiving a certain number of bits, samples, or other units of data, one or more training examples' elements to be used as or compared to inputs and/or outputs may be modified to have such a number of units of data. For instance, a computing device, processor, and/or module may convert a smaller number of units, such as in a low pixel count image, into a desired number of units, for instance by upsampling and interpolating. As a non-limiting example, a low pixel count image may have 100 pixels, however a desired number of pixels may be 128. Processor may interpolate the low pixel count image to convert the 100 pixels into 128 pixels. It should also be noted that one of ordinary skill in the art, upon reading this disclosure, would know the various methods to interpolate a smaller number of data units such as samples, pixels, bits, or the like to a desired number of such units. In some instances, a set of interpolation rules may be trained by sets of highly detailed inputs and/or outputs and corresponding inputs and/or outputs downsampled to smaller numbers of units, and a neural network or other machine learning model that is trained to predict interpolated pixel values using the training data. As a non-limiting example, a sample input and/or output, such as a sample picture, with sample-expanded data units (e.g., pixels added between the original pixels) may be input to a neural network or machine-learning model and output a pseudo replica sample-picture with dummy values assigned to pixels between the original pixels based on a set of interpolation rules. As a non-limiting example, in the context of an image classifier, a machine-learning model may have a set of interpolation rules trained by sets of highly detailed images and images that have been downsampled to smaller numbers of pixels, and a neural network or other machine learning model that is trained using those examples to predict interpolated pixel values in a facial picture context. As a result, an input with sample-expanded data units (the ones added between the original data units, with dummy values) may be run through a trained neural network and/or model, which may fill in values to replace the dummy values. Alternatively or additionally, processor, computing device, and/or module may utilize sample expander methods, a low-pass filter, or both. As used in this disclosure, a "low-pass filter" is a filter that passes signals with a frequency lower than a selected cutoff frequency and attenuates signals with frequencies higher than the cutoff frequency. The exact frequency response of the filter depends on the filter design. Computing device, processor, and/or module may use averaging, such as luma or chroma averaging in images, to fill in data units in between original data units.

In some embodiments, and with continued reference to FIG. 2, computing device, processor, and/or module may down-sample elements of a training example to a desired lower number of data elements. As a non-limiting example, a high pixel count image may have 256 pixels, however a desired number of pixels may be 128. Processor may down-sample the high pixel count image to convert the 256 pixels into 128 pixels. In some embodiments, processor may be configured to perform downsampling on data. Downsampling, also known as decimation, may include removing every Nth entry in a sequence of samples, all but every Nth entry, or the like, which is a process known as "compression," and may be performed, for instance by an N-sample compressor implemented using hardware or software. Anti-aliasing and/or anti-imaging filters, and/or low-pass filters, may be used to clean up side-effects of compression.

Further referring to FIG. 2, feature selection includes narrowing and/or filtering training data to exclude features and/or elements, or training data including such elements, that are not relevant to a purpose for which a trained machine-learning model and/or algorithm is being trained, and/or collection of features and/or elements, or training data including such elements, on the basis of relevance or utility for an intended task or purpose for a trained machine-learning model and/or algorithm is being trained. Feature selection may be implemented, without limitation, using any process described in this disclosure, including without limitation using training data classifiers, exclusion of outliers, or the like.

With continued reference to FIG. 2, feature scaling may include, without limitation, normalization of data entries, which may be accomplished by dividing numerical fields by norms thereof, for instance as performed for vector normalization. Feature scaling may include absolute maximum scaling, wherein each quantitative datum is divided by the maximum absolute value of all quantitative data of a set or subset of quantitative data. Feature scaling may include min-max scaling, in which each value X has a minimum value $X_{min}$ in a set or subset of values subtracted therefrom, with the result divided by the range of the values, give maximum value in the set or subset $$X_{max} : X_{new} = \frac{X - X_{min}}{X_{max} - X_{min}}$$

Feature scaling may include mean normalization, which involves use of a mean value of a set and/or subset of values, $X_{mean}$ with maximum and minimum values:

$$X_{new} = \frac{X - X_{mean}}{X_{max} - X_{min}}$$

Feature scaling may include standardization, where a difference between X and $X_{mean}$ is divided by a standard deviation $\sigma$ of a set or subset of values:

$$X_{new} = \frac{X - X_{mean}}{\sigma}.$$

Scaling may be performed using a median value of a a set or subset $X_{median}$ and/or interquartile range (IQR), which represents the difference between the $25^{th}$ percentile value and the $50^{th}$ percentile value (or closest values thereto by a rounding protocol), such as:

$$X_{new} = \frac{X - X_{median}}{IQR}.$$

Persons skilled in the art, upon reviewing the entirety of this disclosure, will be aware of various alternative or additional approaches that may be used for feature scaling.

Further referring to FIG. 2, computing device, processor, and/or module may be configured to perform one or more processes of data augmentation. "Data augmentation" as used in this disclosure is addition of data to a training set using elements and/or entries already in the dataset. Data augmentation may be accomplished, without limitation, using interpolation, generation of modified copies of existing entries and/or examples, and/or one or more generative AI processes, for instance using deep neural networks and/or generative adversarial networks; generative processes may be referred to alternatively in this context as "data synthesis" and as creating "synthetic data." Augmentation may include performing one or more transformations on data, such as geometric, color space, affine, brightness, cropping, and/or contrast transformations of images.

Still referring to FIG. 2, machine-learning module 200 may be configured to perform a lazy-learning process 220 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 204. Heuristic may include selecting some number of highest-ranking associations and/or training data 204 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 2, machine-learning processes as described in this disclosure may be used to generate machine-learning models 224. A "machine-learning model," as used in this disclosure, is a data structure representing and/or instantiating a mathematical and/or algorithmic representation of a relationship between inputs and outputs, as generated using any machine-learning process including without limitation any process as described above, and stored in memory; an input is submitted to a machine-learning model 224 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 224 may be generated by creating an artificial neural network, such as a convolutional neural network comprising an input layer of nodes, one or more intermediate layers, and an output layer of nodes. Connections between nodes may be created via the process of "training" the network, in which elements from a training data 204 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 2, machine-learning algorithms may include at least a supervised machine-learning process 228. At least a supervised machine-learning process 228, as defined herein, include algorithms that receive a training set relating a number of inputs to a number of outputs, and seek to generate one or more data structures representing and/or instantiating one or more mathematical relations relating inputs to outputs, where each of the one or more mathematical relations is optimal according to some criterion specified to the algorithm using some scoring function. For instance, a supervised learning algorithm may include a digital twin comprising at least a plurality of virtual nodes, wherein each node is associated with an entity of a plurality of entities, as inputs, and a predicted output as an output, and a scoring function representing a desired form of relationship to be detected between inputs and outputs; the scoring function may, for instance, seek to maximize the probability that a given configuration of virtual nodes within the digital twin is associated with a desired predicted output or to minimize the probability that the configuration is associated with an undesired predicted output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 204. Persons skilled in the art, upon reviewing the entirety of this disclosure, will be aware of various possible variations of at least a supervised machine-learning process 228 that may be used to determine relation between inputs and outputs. Supervised machine-learning processes may include classification algorithms as defined above.

With further reference to FIG. 2, training a supervised machine-learning process may include, without limitation, iteratively updating coefficients, biases, weights based on an error function, expected loss, and/or risk function. For instance, an output generated by a supervised machine-learning model using an input example in a training example may be compared to an output example from the training example; an error function may be generated based on the comparison, which may include any error function suitable for use with any machine-learning algorithm described in this disclosure, including a square of a difference between one or more sets of compared values or the like. Such an error function may be used in turn to update one or more weights, biases, coefficients, or other parameters of a machine-learning model through any suitable process including without limitation gradient descent processes, least-squares processes, and/or other processes described in this disclosure. This may be done iteratively and/or recursively to gradually tune such weights, biases, coefficients, or other parameters. Updating may be performed, in neural networks, using one or more back-propagation algorithms. Iterative and/or recursive updates to weights, biases, coefficients, or other parameters as described above may be performed until currently available training data is exhausted and/or until a convergence test is passed, where a "convergence test" is a test for a condition selected as indicating that a model and/or weights, biases, coefficients, or other parameters thereof has reached a degree of accuracy. A convergence test may, for instance, compare a difference between two or more successive errors or error function values, where differences below a threshold amount may be taken to indicate convergence. Alternatively or additionally, one or more errors and/or error function values evaluated in training iterations may be compared to a threshold.

Still referring to FIG. 2, a computing device, processor, and/or module may be configured to perform method, method step, sequence of method steps and/or algorithm described in reference to this figure, in any order and with any degree of repetition. For instance, a computing device, processor, and/or module may be configured to perform a single step, sequence and/or algorithm repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. A computing device, processor, and/or module may perform any step, sequence of steps, or algorithm in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Further referring to FIG. 2, machine learning processes may include at least an unsupervised machine-learning processes 232. An unsupervised machine-learning process, as used herein, is a process that derives inferences in datasets without regard to labels; as a result, an unsupervised machine-learning process may be free to discover any structure, relationship, and/or correlation provided in the data. Unsupervised processes 232 may not require a response variable; unsupervised processes 232 may be used to find interesting patterns and/or inferences between variables, to determine a degree of correlation between two or more variables, or the like.

Still referring to FIG. 2, machine-learning module 200 may be designed and configured to create a machine-learning model 224 using techniques for development of linear regression models. Linear regression models may include ordinary least squares regression, which aims to minimize the square of the difference between predicted outputs and actual outcomes according to an appropriate norm for measuring such a difference (e.g. a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 2, machine-learning algorithms may include, without limitation, linear discriminant analysis. Machine-learning algorithm may include quadratic discriminant analysis. Machine-learning algorithms may include kernel ridge regression. Machine-learning algorithms may include support vector machines, including without limitation support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized trees, AdaBoost, gradient tree boosting, and/or voting classifier methods. Machine-learning algorithms may include neural net algorithms, including convolutional neural net processes.

Still referring to FIG. 2, a machine-learning model and/or process may be deployed or instantiated by incorporation into a program, apparatus, system and/or module. For instance, and without limitation, a machine-learning model, neural network, and/or some or all parameters thereof may be stored and/or deployed in any memory or circuitry. Parameters such as coefficients, weights, and/or biases may be stored as circuit-based constants, such as arrays of wires and/or binary inputs and/or outputs set at logic "1" and "0" voltage levels in a logic circuit to represent a number according to any suitable encoding system including twos complement or the like or may be stored in any volatile and/or non-volatile memory. Similarly, mathematical operations and input and/or output of data to or from models, neural network layers, or the like may be instantiated in hardware circuitry and/or in the form of instructions in firmware, machine-code such as binary operation code instructions, assembly language, or any higher-order programming language. Any technology for hardware and/or software instantiation of memory, instructions, data structures, and/or algorithms may be used to instantiate a machine-learning process and/or model, including without limitation any combination of production and/or configuration of non-reconfigurable hardware elements, circuits, and/or modules such as without limitation ASICs, production and/or configuration of reconfigurable hardware elements, circuits, and/or modules such as without limitation FPGAs, production and/or of non-reconfigurable and/or configuration non-rewritable memory elements, circuits, and/or modules such as without limitation non-rewritable ROM, production and/or configuration of reconfigurable and/or rewritable memory elements, circuits, and/or modules such as without limitation rewritable ROM or other memory technology described in this disclosure, and/or production and/or configuration of any computing device and/or component thereof as described in this disclosure. Such deployed and/or instantiated machine-learning model and/or algorithm may receive inputs from any other process, module, and/or component described in this disclosure, and produce outputs to any other process, module, and/or component described in this disclosure.

Continuing to refer to FIG. 2, any process of training, retraining, deployment, and/or instantiation of any machine-learning model and/or algorithm may be performed and/or repeated after an initial deployment and/or instantiation to correct, refine, and/or improve the machine-learning model and/or algorithm. Such retraining, deployment, and/or instantiation may be performed as a periodic or regular process, such as retraining, deployment, and/or instantiation at regular elapsed time periods, after some measure of volume such as a number of bytes or other measures of data processed, a number of uses or performances of processes described in this disclosure, or the like, and/or according to a software, firmware, or other update schedule. Alternatively or additionally, retraining, deployment, and/or instantiation may be event-based, and may be triggered, without limitation, by user inputs indicating sub-optimal or otherwise problematic performance and/or by automated field testing and/or auditing processes, which may compare outputs of machine-learning models and/or algorithms, and/or errors and/or error functions thereof, to any thresholds, convergence tests, or the like, and/or may compare outputs of processes described herein to similar thresholds, convergence tests or the like. Event-based retraining, deployment, and/or instantiation may alternatively or additionally be triggered by receipt and/or generation of one or more new training examples; a number of new training examples may be compared to a preconfigured threshold, where exceeding the preconfigured threshold may trigger retraining, deployment, and/or instantiation.

Still referring to FIG. 2, retraining and/or additional training may be performed using any process for training described above, using any currently or previously deployed version of a machine-learning model and/or algorithm as a starting point. Training data for retraining may be collected, preconditioned, sorted, classified, sanitized or otherwise processed according to any process described in this disclosure. Training data may include, without limitation, training examples including inputs and correlated outputs used, received, and/or generated from any version of any system, module, machine-learning model or algorithm, apparatus, and/or method described in this disclosure; such examples may be modified and/or labeled according to user feedback or other processes to indicate desired results, and/or may have actual or measured results from a process being modeled and/or predicted by system, module, machine-learning model or algorithm, apparatus, and/or method as "desired" results to be compared to outputs for training processes as described above.

Redeployment may be performed using any reconfiguring and/or rewriting of reconfigurable and/or rewritable circuit and/or memory elements; alternatively, redeployment may be performed by production of new hardware and/or software components, circuits, instructions, or the like, which may be added to and/or may replace existing hardware and/or software components, circuits, instructions, or the like.

Further referring to FIG. 2, one or more processes or algorithms described above may be performed by at least a dedicated hardware unit 236. A "dedicated hardware unit," for the purposes of this figure, is a hardware component, circuit, or the like, aside from a principal control circuit and/or processor performing method steps as described in this disclosure, that is specifically designated or selected to perform one or more specific tasks and/or processes described in reference to this figure, such as without limitation preconditioning and/or sanitization of training data and/or training a machine-learning algorithm and/or model. A dedicated hardware unit 236 may include, without limitation, a hardware unit that can perform iterative or massed calculations, such as matrix-based calculations to update or tune parameters, weights, coefficients, and/or biases of machine-learning models and/or neural networks, efficiently using pipelining, parallel processing, or the like; such a hardware unit may be optimized for such processes by, for instance, including dedicated circuitry for matrix and/or signal processing operations that includes, e.g., multiple arithmetic and/or logical circuit units such as multipliers and/or adders that can act simultaneously and/or in parallel or the like. Such dedicated hardware units 236 may include, without limitation, graphical processing units (GPUs), dedicated signal processing modules, FPGA or other reconfigurable hardware that has been configured to instantiate parallel processing units for one or more specific tasks, or the like, A computing device, processor, apparatus, or module may be configured to instruct one or more dedicated hardware units 236 to perform one or more operations described herein, such as evaluation of model and/or algorithm outputs, one-time or iterative updates to parameters, coefficients, weights, and/or biases, and/or any other operations such as vector and/or matrix operations as described in this disclosure.

Figure 3:
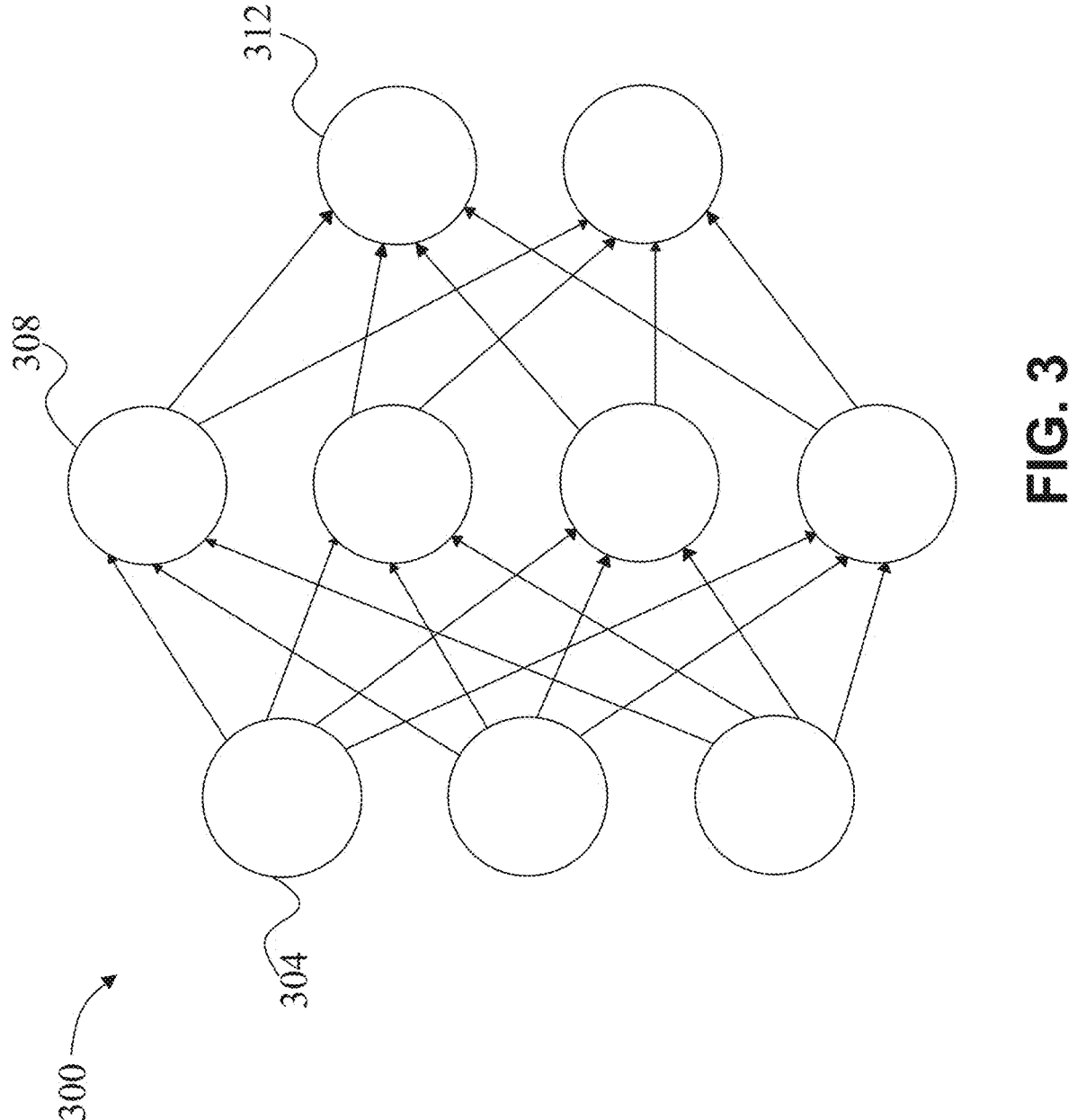
FIG. 3 is a diagram of an exemplary embodiment of a neural network.

Referring now to FIG. 3, an exemplary embodiment of neural network 300 is illustrated. A neural network 300 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 304, one or more intermediate layers 308, and an output layer of nodes 312. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network, or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 4:
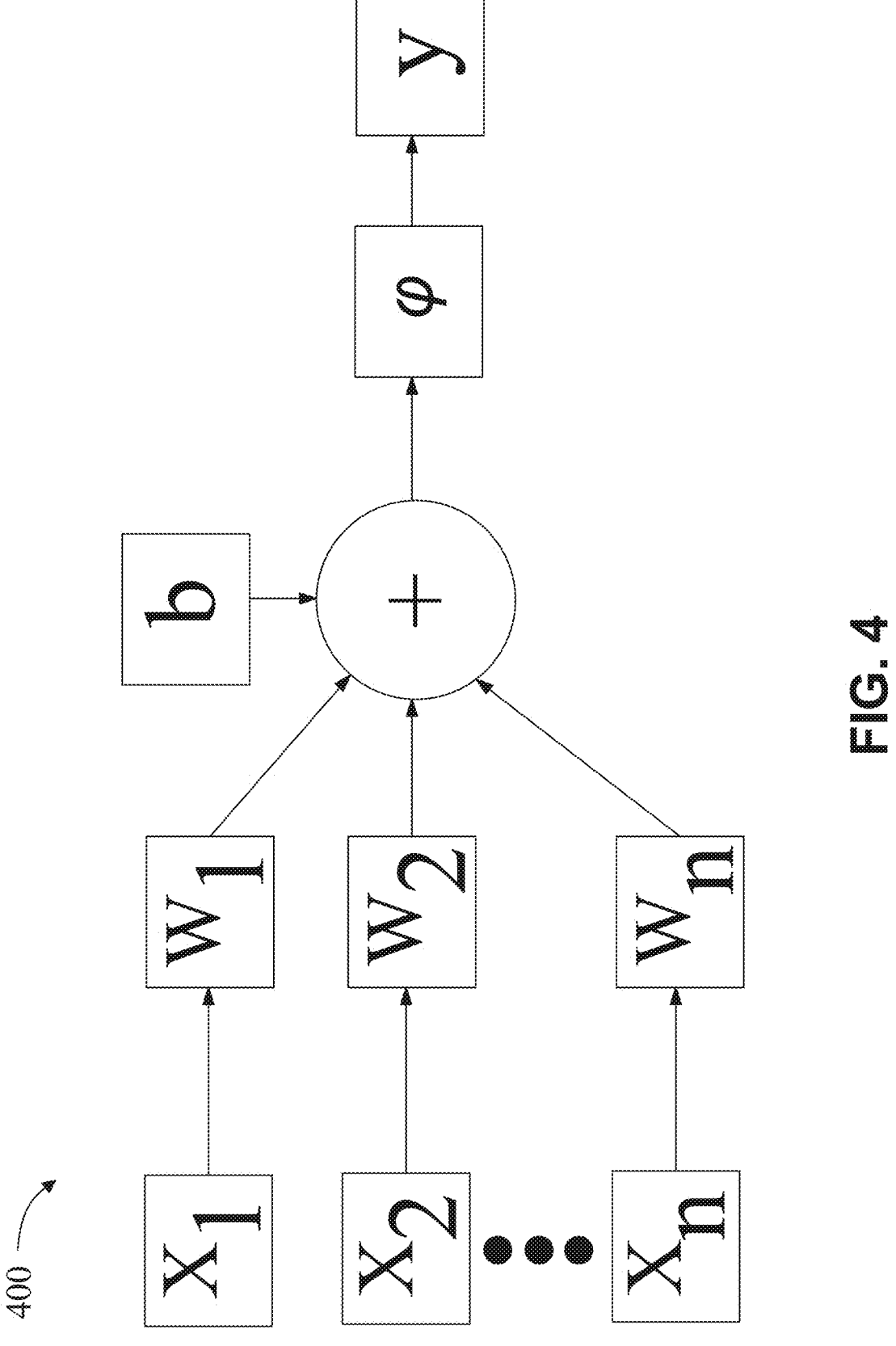
FIG. 4 is a diagram of an exemplary embodiment of a node of a neural network.

Referring now to FIG. 4, an exemplary embodiment of a node 400 of a neural network is illustrated. A node may include, without limitation, a plurality of inputs $x_i$ that may receive numerical values from inputs to a neural network containing the node and/or from other nodes. Node may perform one or more activation functions to produce its output given one or more inputs, such as without limitation computing a binary step function comparing an input to a threshold value and outputting either a logic 1 or logic 0 output or something equivalent, a linear activation function whereby an output is directly proportional to the input, and/or a non-linear activation function, wherein the output is not proportional to the input. Non-linear activation functions may include, without limitation, a sigmoid function of the form $$f(x) = \frac{1}{1 - e^{-x}}$$

given input x, a tanh (hyperbolic tangent) function, of the form $$\frac{e^x - e^{-x}}{e^x + e^{-x}}$$

a tanh derivative function such as $f(x)=\tanh^2(x)$, a rectified linear unit function such as $f(x)=\max(0, x)$, a "leaky" and/or "parametric" rectified linear unit function such as $f(x)=\max(ax, x)$ for some a, an exponential linear units function such as $$f(x) = \begin{cases} x \text{ for } x \geq 0 \\ \alpha(e^x - 1) \text{ for } x < 0 \end{cases}$$

for some value of $\alpha$ (this function may be replaced and/or weighted by its own derivative in some embodiments), a softmax function such as $$f(x_i) = \frac{e^x}{\sum_i x_i}$$

where the inputs to an instant layer are $x_i$, a swish function such as $f(x)=x^*\text{sigmoid}(x)$, a Gaussian error linear unit function such as $f(x)=a(1+\tanh(\sqrt{2/\pi}(x+bx^r)))$ for some values of a, b, and r, and/or a scaled exponential linear unit function such as $$f(x) = \lambda \begin{cases} \alpha(e^x - 1) \text{ for } x < 0 \\ x \text{ for } x \geq 0 \end{cases}.$$

Fundamentally, there is no limit to the nature of functions of inputs $x_i$ that may be used as activation functions. As a non-limiting and illustrative example, node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function φ, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$ may be determined by training a neural network using training data, which may be performed using any suitable process as described above.

Figure 5:
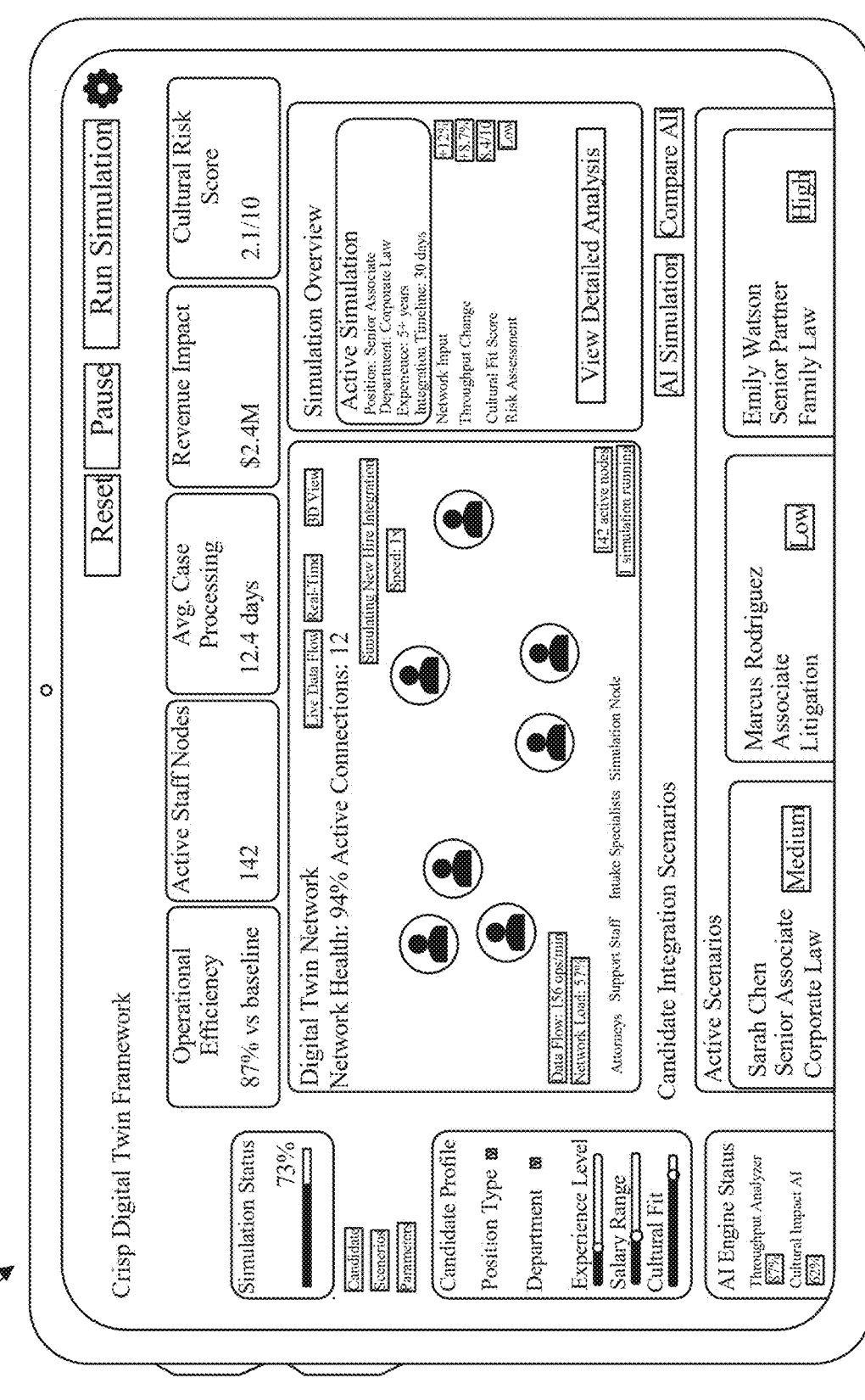
FIG. 5 is an exemplary embodiment of a graphical user interface of a digital twin.

Referring now to FIG. 5, an exemplary embodiment 500 of a graphical user interface of a digital twin. Without limitation, the exemplary embodiment 500 may include a graphical user interface. In an embodiment, the GUI may be displayed using a downstream device. In an embodiment, the GUI may illustrate operational efficiency metrics, active staff nodes, average case processing time, revenue impact, and cultural risk scores. The GUI may further display a simulation status indicator, candidate profile parameters such as position type, department, experience level, salary range, and cultural fit, as well as active candidate integration scenarios. In some implementations, the GUI may depict a digital twin network view showing data flow, active connections, and simulation nodes, alongside a simulation overview that includes candidate position details, department, experience, integration timeline, throughput changes, and risk assessments. The GUI may also provide user-selectable options such as reset, pause, run simulation, view detailed analysis, and comparison across simulation scenarios.

Referring now to FIG. 6, a flow diagram of an exemplary method 600 for generating a predicted output is illustrated. At step 605, method 600 includes receiving, using at least a processor, a digital twin comprising at least a plurality of virtual nodes, wherein each node is associated with an entity of a plurality of entities. In an embodiment, the at least a processor may be further configured to generate the digital twin by defining at least an objective of the digital twin, collecting operational data associated with the plurality of nodes and an environment, generating, using a machine learning model, the digital twin as a function of the operational data, and updating, using one or more data streams, the digital twin wherein the one or more data streams provide new operational data associated with the plurality of nodes and the environment. This may be implemented as described and with reference to FIGS. 1-4.

Still referring to FIG. 6, at step 610, method 600 includes determining, using the at least a processor, a first scenario of a plurality of scenarios comprising one or more candidate nodes of a one or more candidate nodes, wherein each candidate node of the one or more candidate nodes are assigned a role of a plurality of roles within the digital twin. In an embodiment, each candidate node may be associated with a third party of a plurality of third parties and each candidate node comprises third party data associated with the corresponding third party. This may be implemented as described and with reference to FIGS. 1-4.

Still referring to FIG. 6, at step 615, method 600 includes integrating, using the at least a processor, the first scenario with the digital twin. This may be implemented as described and with reference to FIGS. 1-4.

Still referring to FIG. 6, at step 620, method 600 includes calculating, using an AI simulator, scores corresponding to a plurality of variables associated with the integration of the first scenario and the digital twin, wherein the AI simulator propagates learned parameters through the digital twin. In an embodiment, the at least a processor may be further configured to calculate, using the AI simulator, the scores by instantiating the one or more candidate nodes as agents within the digital twin, simulating interactions of the agents with other nodes according to the learned parameters, mapping a plurality of operational metrics of the one or more candidate nodes to corresponding operational metrics of the plurality of virtual nodes of the digital twin, comparing the mapped operational metrics, identifying a degree of concordance of the mapped operational metrics, and assigning a score of the scores to each variable of the plurality of variables associated with the integration. This may be implemented as described and with reference to FIGS. 1-4.

Still referring to FIG. 6, at step 625, method 600 includes generating, using the at least a processor, a predicted output as a function of the integration and the scores. In an embodiment, the predictive output may include one or more predicted operational outcomes. In an embodiment, the at least a processor may be further configured to transmit the predicted output to a downstream model, wherein the downstream model is configured to identify the one or more candidate nodes from a candidate database. In an embodiment, the at least a processor may be further configured to integrate a second scenario with the digital twin, calculate, using the AI simulator, scores corresponding to the plurality of variables associated with the integration of the second scenario and the digital twin, and generate one or more alternative predicted outputs as a function of the integration and the scores. In an embodiment, the at least a processor may be further configured to generate a recommendation as a function of ranking a plurality of predictive outputs of the predictive output as a function of the scores and user input. In an embodiment, the at least a processor may be further configured to display, using a user interface, a visualization corresponding to the predicted output, wherein the visualization comprises a graphical representation of the plurality of scenarios and a simulation timeline. In an embodiment, the at least a processor may be further configured to calibrate the AI simulator using historical operational data associated with the plurality of nodes, wherein calibrating comprises adjusting node parameters within the digital twin to observed outcomes. This may be implemented as described and with reference to FIGS. 1-4.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
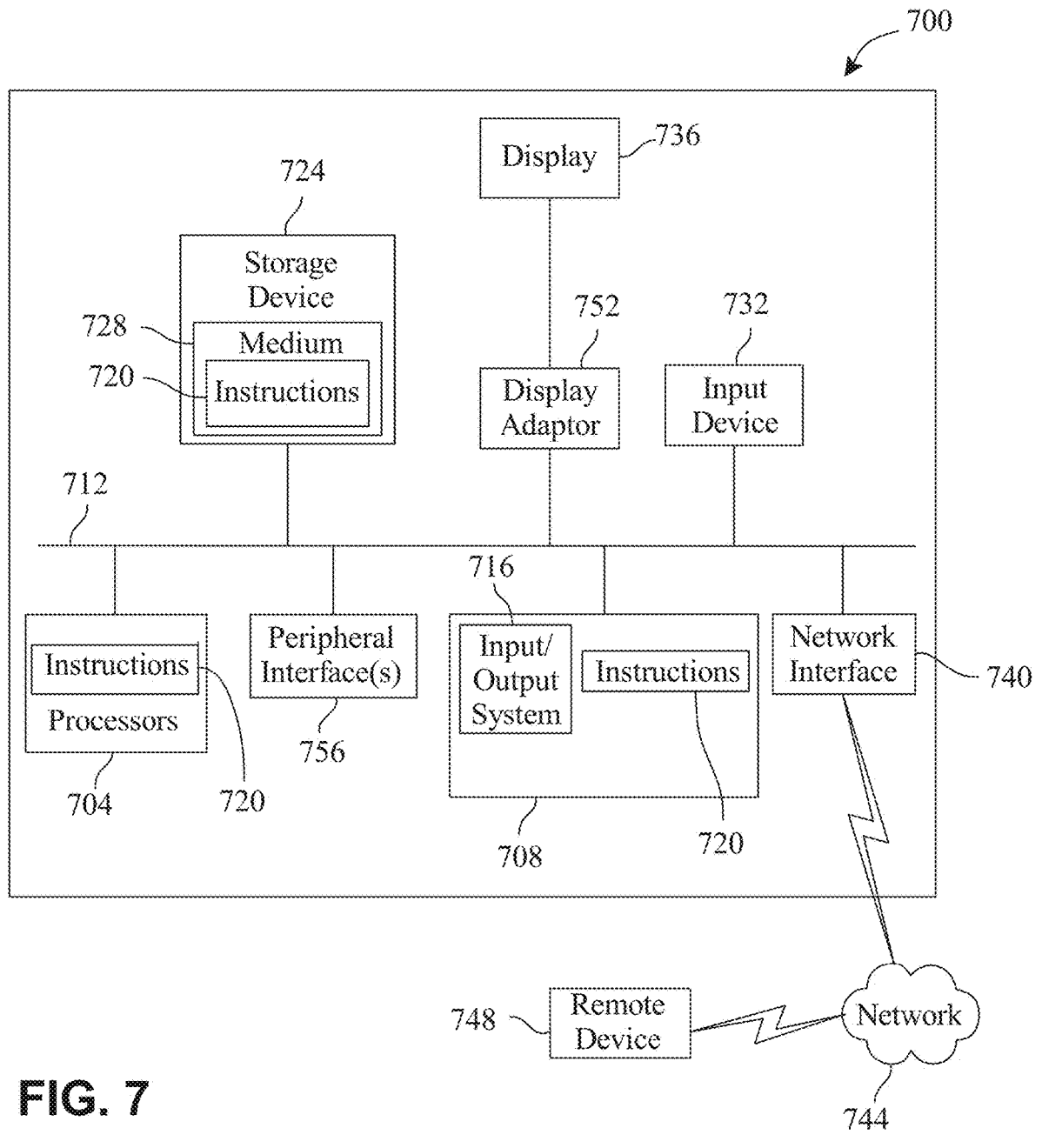
FIG. 7 is a block diagram of a computing system that can be used to implement any one or more of the methodologies disclosed herein and any one or more portions thereof.

FIG. 7 shows a diagrammatic representation of one embodiment of computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), system on module (SOM), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIRE-WIRE interface, a direct interface to bus 712, and any combinations thereof. Input device 732 may include a touch screen interface that may be a part of or separate from display device 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed:

1. An apparatus for generating a predicted output, wherein the apparatus comprises:

at least a computing device, wherein the computing device comprises:

a memory; and at least a processor communicatively connected to the memory, wherein the memory contains instructions configuring the at least a processor to:

receive a digital twin comprising at least a plurality of virtual nodes, wherein each node is associated with an entity of a plurality of entities;

determine a first scenario of a plurality of scenarios comprising one or more candidate nodes, wherein each candidate node is assigned a role of a plurality of roles within the digital twin;

integrate the first scenario with the digital twin;

calculate, using an artificial intelligence (AI) simulator, scores corresponding to a plurality of variables associated with the integration of the first scenario and the digital twin, wherein the AI simulator propagates learned parameters through the digital twin, wherein calculating, using the AI simulator, the scores further comprise:

instantiating the one or more candidate nodes as agents within the digital twin; simulating interactions of the agents with other nodes according to the learned parameters;

mapping a plurality of operational metrics of the one or more candidate nodes to corresponding operational metrics of the plurality of virtual nodes of the digital twin;

comparing the mapped operational metrics;

identifying a degree of concordance of the mapped operational metrics; and assigning a score to each variable of the plurality of variables associated with the integration;

generate a predicted output as a function of the integration and the scores; and provide, using a user interface, a recommendation as a function of ranking a plurality of predictive outputs of the predictive output as a function of the scores and user input in real-time.

2. The apparatus of claim 1, wherein the predictive output comprises one or more predicted operational outcomes.

3. The apparatus of claim 1, wherein:

each candidate node is associated with a third party of a plurality of third parties, and each candidate node comprises third party data associated with a corresponding third party.

4. The apparatus of claim 1, wherein the at least a processor is further configured to generate the digital twin by:

defining at least an objective of the digital twin;

collecting operational data associated with the plurality of nodes and an environment;

generating, using a machine learning model, the digital twin as a function of the operational data; and updating, using one or more data streams, the digital twin wherein the one or more data streams provide new operational data associated with the plurality of nodes and the environment.

5. The apparatus of claim 1, wherein the at least a processor is further configured to transmit the predicted output to a downstream model, wherein the downstream model is configured to identify the one or more candidate nodes from a candidate database.

6. The apparatus of claim 1, wherein the at least a processor is further configured to:

integrate a second scenario with the digital twin;

calculate, using the AI simulator, scores corresponding to the plurality of variables associated with the integration of the second scenario and the digital twin; and generate one or more alternative predicted outputs as a function of the integration and the scores.

7. The apparatus of claim 1, wherein the at least a processor is further configured to generate a recommendation as a function of ranking a plurality of predictive outputs of the predictive output as a function of the scores and user input.

8. The apparatus of claim 1, wherein the at least a processor is further configured to display, using the user interface, a visualization corresponding to the predicted output, wherein the visualization comprises a graphical representation of the plurality of scenarios and a simulation timeline.

9. The apparatus of claim 1, wherein the at least a processor is further configured to calibrate the AI simulator using historical operational data associated with the plurality of nodes, wherein calibrating comprises adjusting node parameters within the digital twin to observed outcomes.

10. A method for generating a predicted output, wherein the method comprises:

receiving, using at least a processor, a digital twin comprising at least a plurality of virtual nodes, wherein each node is associated with an entity of a plurality of entities;

determining, using the at least a processor, a first scenario of a plurality of scenarios comprising one or more candidate nodes of a one or more candidate nodes, wherein each candidate node of the one or more candidate nodes are assigned a role of a plurality of roles within the digital twin;

integrating, using the at least a processor, the first scenario with the digital twin;

calculating, using an artificial intelligence (AI) simulator, scores corresponding to a plurality of variables associated with the integration of the first scenario and the digital twin, wherein the AI simulator propagates learned parameters through the digital twin wherein calculating, using the AI simulator, the scores further comprise:

instantiating the one or more candidate nodes as agents within the digital twin; simulating interactions of the agents with other nodes according to the learned parameters;

mapping a plurality of operational metrics of the one or more candidate nodes to corresponding operational metrics of the plurality of virtual nodes of the digital twin;

comparing the mapped operational metrics;

identifying a degree of concordance of the mapped operational metrics; and assigning a score to each variable of the plurality of variables associated with the integration;

generating, using the at least a processor, a predicted output as a function of the integration and the scores;

providing, using a user interface, a recommendation as a function of ranking a plurality of predictive outputs of the predictive output as a function of the scores and user input in real-time.

11. The method of claim 10, wherein the predictive output comprises one or more predicted operational outcomes.

12. The method of claim 10, wherein:

each candidate node is associated with a third party of a plurality of third parties, and each candidate node comprises third party data associated with a corresponding third party.

13. The method of claim 10, further comprising generating, using the at least a processor, the digital twin by:

defining, using the at least a processor, at least an objective of the digital twin;

collecting, using the at least a processor, operational data associated with the plurality of nodes and an environment;

generating, using a machine learning model, the digital twin as a function of the operational data;

updating, using one or more data streams, the digital twin wherein the one or more data streams provide new operational data associated with the plurality of nodes and the environment.

14. The method of claim 10, further comprising transmitting, using the at least a processor, the predicted output to a downstream model, wherein the downstream model identifies the one or more candidate nodes from a candidate database.

15. The method of claim 10, further comprising:

integrating, using the at least a processor, a second scenario with the digital twin;

calculating, using the AI simulator, scores corresponding to the plurality of variables associated with the integration of the second scenario and the digital twin; and generating, using the at least a processor, one or more alternative predicted outputs as a function of the integration and the scores.

16. The method of claim 10, further comprising generating, using the at least a processor, a recommendation as a function of ranking a plurality of predictive outputs of the predictive output as a function of the scores and user input.

17. The method of claim 10, further comprising displaying, using the user interface, a visualization corresponding to the predicted output, wherein the visualization comprises a graphical representation of the plurality of scenarios and a simulation timeline.

18. The method of claim 10, further comprising calibrating, using the at least a processor, the AI simulator using historical operational data associated with the plurality of nodes by adjusting node parameters within the digital twin to observed outcomes.

\* \* \* \* \*